United States Patent
Nakagawa

(10) Patent No.: US 7,333,033 B2
(45) Date of Patent: *Feb. 19, 2008

(54) MODULATION TABLE, MODULATING DEVICE AND METHOD, PROGRAM, AND RECORDING MEDIUM

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/558,300

(22) Filed: Nov. 9, 2006

(65) Prior Publication Data

US 2007/0103353 A1 May 10, 2007

(30) Foreign Application Priority Data

Nov. 10, 2005 (JP) ............................. P2005-326604

(51) Int. Cl.
*H03M 7/00* (2006.01)
(52) U.S. Cl. ............................. 341/59; 341/65; 341/67; 341/106
(58) Field of Classification Search .................. 341/59, 341/65, 67, 68, 69, 106
See application file for complete search history.

(56) References Cited

U.S. PATENT DOCUMENTS

| 5,506,581 | A | | 4/1996 | Ino et al. |
| 5,659,577 | A | * | 8/1997 | Ohishi ......................... 375/242 |
| 5,881,037 | A | * | 3/1999 | Tanaka et al. ............ 369/59.24 |
| 6,072,756 | A | * | 6/2000 | Shigenobu ................ 369/47.19 |
| 6,198,710 | B1 | * | 3/2001 | Hori et al. ................ 369/59.24 |
| 6,496,541 | B1 | | 12/2002 | Kahlman et al. |
| 6,677,866 | B2 | * | 1/2004 | Kahlman et al. ............. 341/59 |
| 7,116,250 | B2 | * | 10/2006 | Coene .......................... 341/68 |
| 7,119,721 | B2 | * | 10/2006 | Coene .......................... 341/59 |
| 7,158,060 | B2 | * | 1/2007 | Kahlman et al. ............. 341/67 |
| 7,215,261 | B2 | * | 5/2007 | Ushiyama et al. ........... 341/59 |

FOREIGN PATENT DOCUMENTS

| JP | 6-197024 | 4/1994 |
| JP | 11-346154 | 12/1999 |

OTHER PUBLICATIONS

Nakagawa, U.S. Appl. No. 11/556,946, filed Nov. 6, 2006.*

* cited by examiner

*Primary Examiner*—Linh Nguyen
(74) *Attorney, Agent, or Firm*—Bell, Boyd & Lloyd LLP

(57) ABSTRACT

A modulation table configured to convert data having a basic data length of m bits into variable length code (d, k; m, n; r) is provided. The modulation table includes a maximum constraint length $r>1$, a minimum run of d ($d>0$), a maximum run of k, and a basic codeword length of n bits. The modulation table includes: a basic table configured to convert patterns composed of data having a data length of m bits into patterns composed of codes of variable length code having a codeword length of n bits; and a substitution table configured to replace patterns composed of substitution data with patterns composed of substitution codes. The substitution table includes patterns composed of minimum run successive occurrence limiting data limiting the minimum run to a maximum of N ($N>1$) times and code patterns composed of substitution codes corresponding to the minimum run successive occurrence limiting data. At least one of the substitution codes corresponding to the minimum run successive occurrence limiting data includes an indeterminate code a value of which is determined by one of an immediately preceding codeword string and an immediately succeeding codeword string.

16 Claims, 19 Drawing Sheets

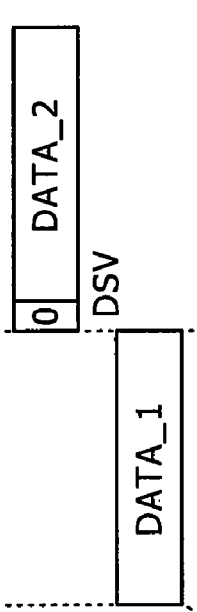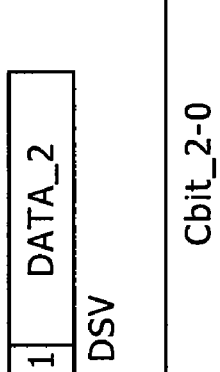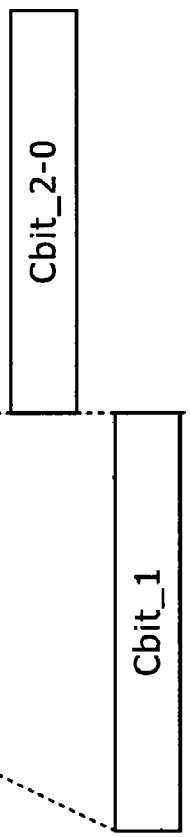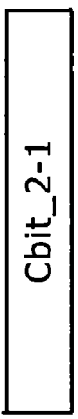
FIG.21A  FIG.21B  FIG.21B0  FIG.21B1  FIG.21C0  FIG.21C1

MODULATION TABLE, MODULATING DEVICE AND METHOD, PROGRAM, AND RECORDING MEDIUM

CROSS REFERENCES TO RELATED APPLICATIONS

The present applications claims priority to Japanese Patent Application JP 2005-326604 filed in the Japanese Patent Office on Nov. 10, 2005, the entire contents of which being incorporated herein by reference.

BACKGROUND

The present disclosure relates to a modulation table, a device and a method for modulation, a program, and a recording medium, and particularly to a modulation table, a device and a method for modulation, a program, and a recording medium that further reduce successive occurrences of a minimum run.

When data is to be transmitted to a predetermined transmission line or to be recorded onto a recording medium such for example as a magnetic disk, an optical disk, or a magneto-optical disk, the data is modulated to become suitable for the transmission line or the recording medium. Known as one of methods of such modulation is a block code. The block code blocks a data string into units (hereinafter referred to as data words) each including m×i bits, and converts the data words to codewords each including n×i bits according to an appropriate code rule. When i=1, this code is fixed length code. When a plurality of values can be selected for i, that is, a predetermined i in a range of one to i max (a maximum of i), and then conversion is performed, the code is variable length code. The block-coded code is expressed as variable length code (d, k; m, n; r).

In this code, i is referred to as a constraint length, and i max is r (maximum constraint length). d denotes for example a minimum number of consecutive "0"s inserted between successive "1"s, that is, a minimum run of "0"s. k denotes for example a maximum number of consecutive "0"s inserted between successive "1"s, that is, a maximum run of "0"s.

When codewords obtained as described above are to be recorded onto an optical disk, a magneto-optical disk or the like, in the case of a compact disk (CD) or a Mini-Disc (MD) (registered trademark), for example, a variable length code string is subjected to NRZI (Non Return to Zero Inverted) modulation, in which inversion is performed for "1" and inversion is not performed for "0", and recording is performed on the basis of the NRZI-modulated variable length code (hereinafter referred to as a recording waveform string). This recording is referred to as mark edge recording. On the other hand, in the case of an ISO-standard 3.5-inch magneto-optical disk with a capacity of 230 MB or the like, a code string resulting from recording modulation is recorded as it is without being subjected to NRZI modulation. This recording is referred to as mark position recording. The mark edge recording is often used for current recording media, which have been increased in recording density.

Letting Tmin be a minimum inversion interval of the recording waveform string and Tmax be a maximum inversion interval of the recording waveform string, a longer minimum inversion interval Tmin, or a larger minimum run d is preferred for high recording density in a linear velocity direction. From a viewpoint of clock reproduction, a shorter maximum inversion interval Tmax, or a smaller maximum run k is preferable. When overwriting characteristics are considered, it is preferable that Tmax/Tmin be smaller. Further, it is important from a viewpoint of jitter and S/N that a detection window width Tw=m/n be large, for example. Thus, various modulating methods have been proposed in light of conditions of media, and put to practical use.

Specific modulating systems proposed or actually used for optical disks, magnetic disks, magneto-optical disks, and the like are as follows. An EFM code (also denoted as (2, 10; 8, 17; 1)) used for CDs and MDs, an 8-16 code (also denoted as (2, 10; 1, 2; 1)) used for DVDs (Digital Versatile Disks), and RLL (2, 7) (also denoted as (2, 7; m, n; r)) used for PDs (120 mm and a capacity of 650 MB) are RLL codes with a minimum run d=2. RLL(1, 7) (also denoted as (1, 7; 2, 3; r)) used for MD-DATA2 or an ISO-standard 3.5-inch MO (a capacity of 640 MB) is an RLL code with a minimum run d=1. In addition, recording and reproduction disk devices for optical disks, magneto-optical disks and the like having high recording densities, which are currently being developed and studied, often use an RLL code (Run Length Limited code) with a minimum run length d=1, in which the size of a smallest mark and conversion efficiency are balanced.

A modulation table of the variable length RLL (1, 7) code is for example as follows.

TABLE 1

RLL(1, 7): (d, k; m, n; r) = (1, 7; 2, 3; 2)

| | Data Pattern | Code Pattern |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

A symbol x in the modulation table is "1" when a following channel bit is "0", and is "0" when the following channel bit is "1". The maximum constraint length r is two.

Parameters of variable length RLL (1, 7) are (1, 7; 2, 3, 2). Letting T be a bit interval of the recording waveform string, the minimum inversion interval Tmin expressed by (d+1)T is 2 (=1+1)T. Letting Tdata be a bit interval of the data string, the minimum inversion interval Tmin expressed by (m/n)×2 is 1.33 (=(2/3)×2) Tdata. The maximum inversion interval Tmax expressed by (k+1)T is Tmax=8 (=7+1) T(=(m/n)×8 Tdata=(2/3)×8 Tdata=5.33 Tdata). The detection window width Tw is expressed by (m/n)×Tdata. The value of the detection window width Tw is Tw=0.67(=2/3) Tdata.

In a channel bit string resulting from modulation in accordance with the RLL (1, 7) of Table 1, 2T, which is Tmin, occurs most frequently, and the frequencies of occurrences of 3T, 4T, 5T, 6T . . . are decreased in that order. Repetition of 2T as the minimum run (Tmin), that is, frequent occurrence of edge information in short cycles is often advantageous for clock reproduction.

However, in recording and reproduction of an optical disk, for example, as recording linear density is further increased, an error tends to occur at parts of the minimum run. This is because in disk reproduction, a waveform output of the minimum run is smaller than waveform outputs of other runs and is thus easily affected by for example a defocus and a tangential tilt. In addition, recording and reproduction of successive minimum marks at a high recording linear density is easily affected by disturbances such as noise and the like. Thus, a data reproduction error tends to occur. As a pattern of the data reproduction error at this time, an error in which an entire length of successive smallest marks from a first edge to a last edge is shifted can occur. That is, the length of a bit error that occurs extends from a start to an end of the section of the successive smallest marks. Therefore a problem of a long error propagation occurs.

For stabilization in recording and reproducing data at a high recording linear density, limiting successive occurrences of the minimum run is effective.

When data is to be recorded onto a recording medium or the data is to be transmitted, coding modulation suitable for the recording medium or a transmission line is performed. When modulation codes include a low-frequency component, for example, variations in various error signals for a tracking error and the like in servo control of the disk device tend to occur, or jitter tends to occur. It is therefore desirable to suppress the low-frequency component of the modulation codes as much as possible.

As a method for suppressing the low-frequency component, there is DSV (Digital Sum Value) control. When a channel bit string is subjected to NRZI modulation (that is, level coding) to be converted into a recording code string, and codes are added up with "1" in the bit string (data symbols) taken as +1 and "0" in the bit string taken as −1, DSV represents a total sum of the added-up codes. The DSV serves as an indicator of the low-frequency component of the recording code string. Decreasing the absolute values of positive and negative fluctuations in the DSV, that is, performing DSV control eliminates a direct-current component of the recording code string and suppresses the low-frequency component.

DSV control is not applied to modulation codes generated according to the variable length RLL (1, 7) table shown as Table 1. DSV control in such a case is achieved by performing a DSV calculation at predetermined intervals in a coded string (channel bit string) after modulation and inserting predetermined DSV control bits in the coded string (channel bit string) which is disclosed in Japanese Patent Laid-Open No. Hei 6-197024, for example (hereinafter referred to as Patent Document 1).

The number of DSV control bits to be inserted in the channel bit string is determined by the minimum run d. When d=1, and when DSV control bits are to be inserted at an arbitrary position of codewords in such a manner as to keep the minimum run, two (=d+1) channel bits are necessary. When DSV control bits are to be inserted at an arbitrary position of codewords in such a manner as to keep the maximum run, four (=2×(d+1)) channel bits are necessary. When DSV control is to be performed with fewer channel bits than these channel bits, DSV control may not be achieved, depending on a preceding pattern and a succeeding pattern between which the channel bits are interposed.

In the RLL(1, 7) code with (d, k; m, n)=(1, 7; 2, 3), when the above DSV control bits are converted into data with the conversion rate, Four channel bits×2/3=8/3=about 2.67 data pieces (2.67 Tdata)

The DSV control bits are basically redundant bits. Thus, from a viewpoint of efficiency of code conversion, it is desirable to reduce the number of DSV control bits as much as possible.

Further, it is desirable not to allow the minimum run d and the maximum run k to be changed by inserted DSV control bits. This is because a change in (d, k) affects recording and reproduction characteristics.

In an actual RLL code, however, the minimum run should be kept because the minimum run greatly affects recording and reproduction characteristics, but the maximum run is not necessarily kept. In some cases, there is a format in which a pattern that breaks the maximum run is used as a synchronizing pattern. For example, while a maximum run in the 8-16 code of DVD (Digital Versatile Disk) is 11 T, 14 T exceeding the maximum run is given in the part of a synchronizing pattern to enhance a capability of detecting the synchronizing pattern.

On the basis of the above, the present inventor et al. have previously proposed a 1,7PP code of Table 2 as a modulation system with (d, k)=(1, 7) which system is ready for high recording densities which is disclosed in Japanese Patent Laid-Open No. Hei 11-346154, for example.

TABLE 3

1, 7PP: (d, k; m, n; r) = (1, 7; 2, 3; 4)

| Data Pattern | Code Pattern |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next 010) |
| 00001000 | 000 100 100 100 |
| 00000000 | 010 100 100 100 |
| if xx1 then *0* = 000 | |
| xx0 then *0* = 101 | |

Sync & Termination

01 001 000 000 001 000 000 001 (24 channel bits)
# = 0 not terminate case
# = 1 terminate case Termination Table

| | |
|---|---|
| 00 | 000 |
| 0000 | 010 100 |
| 110111: | 001 000 000 (next 010) |
| When next channel bits are '010', convert '11 01 11' to '001 000 000'. | |

The modulation table of Table 2 includes, as conversion patterns, basic patterns without which conversion processing cannot be carried out (conversion patterns composed of data patterns (11) to (000000)), substitution patterns without which conversion processing can be carried out, but with which more effective conversion processing can be carried out (conversion patterns composed of data patterns (110111), (00001000), and (00000000)), and terminating patterns for terminating a data string at an arbitrary position (conversion patterns composed of data patterns (00) and (0000)).

In addition, Table 2 includes an indeterminate code (a code denoted by a symbol *) as an element of a basic pattern, with a minimum run d=1 and a maximum run k=7. The indeterminate code is set to "0" or "1" so as to keep the minimum run d and the maximum run k regardless of an immediately preceding codeword and an immediately succeeding codeword. Specifically, in Table 2, when a two-piece data pattern to be converted is (11), a code pattern "000" or "101" is selected depending on an immediately preceding codeword string (channel bit string), and the data pattern to be converted is converted to one of the code patterns "000" and "101". For example, when one channel bit of the immediately preceding codeword string is "1", the data pattern (11) is converted to the code pattern "000" to keep the minimum run d. When one channel bit of the immediately preceding codeword string is "0", the data pattern (11) is converted to the code pattern "101" to keep the maximum run k.

The basic patterns of the modulation table of Table 2 have a variable length structure. That is, the number of basic patterns at a constraint length i=1 is three (the three patterns *0*, 001, and 010), which is smaller than a required number of four (=2^m2^2=4). As a result, in converting data strings, there are data strings that cannot be converted with only a constraint length i=1. After all, in order to convert all data strings in Table 2 (to complete Table 2 as a conversion table), it is necessary to refer to basic patterns up to a constraint length i=3.

In addition, the modulation table of Table 2 has a substitution pattern for limiting successive occurrences of the minimum run d. Thus, when a data pattern is (110111), a succeeding code string is further referred to, and when the succeeding code string is "010", the data pattern is replaced with the six-piece-data code pattern "001 000 000". When the succeeding code string is other than "010", the data pattern is converted as units of two-piece data ((11), (01), and (11)) into a code pattern, and hence converted into a codeword "*0* 010 *0*". Thus, successive occurrences of the minimum run in a codeword string resulting from conversion of data are limited, and the minimum run is repeated six times at a maximum.

The modulation table of Table 2 has a maximum constraint length r=4. Conversion patterns with a constraint length i=4 are formed by substitution patterns (maximum run guaranteeing patterns) for realizing the maximum run k=7. Specifically, the data pattern (00001000) is converted to the code pattern "000 100 100 100", and the data pattern (00000000) is converted to the code pattern "010 100 100 100". Also in this case, the minimum run d=1 is kept.

Further, in Table 2, when termination is effected at an arbitrary position of a data string to insert a synchronizing pattern, and when the data string has (00) or (0000) at a terminating position, a termination pattern is used. The inserted synchronizing pattern has a first codeword as a termination pattern use identifying bit. When a termination pattern is used, the first codeword of the immediately succeeding substitution pattern string is "1". When no termination pattern is used, the first codeword is "0". Incidentally, the synchronizing pattern in Table 2 is formed by a total of 24 codewords including the above-mentioned termination pattern use identifying bit and two repetitive code patterns with k=8 exceeding the maximum run k=7 for detection of the synchronizing pattern.

The conversion patterns in Table 2 have a conversion rule that a remainder when the number of "1"s as an element of a data pattern is divided by two and a remainder when the number of "1"s as an element of a converted code pattern is divided by two be both 1 or 0 and thus equal to each other (both elements corresponding to each other have an odd number of "1"s or an even number of "1"s). For example, the data pattern (000001) of the conversion patterns corresponds to the code pattern "010 100 100". The number of "1"s as an element of the data pattern is one, and the number of "1"s as an element of the corresponding code pattern is three. A remainder when the number of "1"s as an element of the data pattern is divided by two and a remainder when the number of "1"s as an element of the code pattern is divided by two are both one (an odd number) and thus match each other. Similarly, the data pattern (000000) of the conversion patterns corresponds to the code pattern "010 100 000". The number of "1"s as an element of the data pattern is zero, and the number of "1"s as an element of the corresponding code pattern is two. A remainder when the number of "1"s as an element of the data pattern is divided by two and a remainder when the number of "1"s as an element of the code pattern is divided by two are both zero (an even number) and thus match each other.

A method of performing DSV control will next be described. DSV control in the past when the DSV control is not performed in a modulation table as in the RLL(1, 7) code of Table 1 is performed by adding at least (d+1) bits at predetermined intervals to a channel bit string after modulation of a data string, for example. While DSV control can be performed in a modulation table such as Table 2 in the same manner as the DSV control in the past, DSV control can be performed more efficiently by utilizing relations between the data patterns and the code patterns in Table 2. Specifically, when the modulation table has the conversion rule that a remainder when the number of "1"s as an element of a data pattern is divided by two and a remainder when the number of "1"s as an element of a code pattern is divided by two be both 1 or 0 and thus the same, insertion of a DSV control bit of "1" representing "inversion" or "0" representing "non-inversion" in a channel bit string as described above is equivalent to insertion of a DSV control bit of (1) for "inversion" or (0) for "non-inversion" in a data bit string.

When a DSV control bit is inserted at the rear of a sequence of three bits (001) to be subjected to data conversion in Table 2, for example, data is (001-x) (x is one bit of "0" or "1"). When "0" is assigned to x, the following conversion is performed in the modulation table of Table 2.

| Data Pattern | Code Pattern |
|---|---|
| 0010 | 010 000 |

When "1" is assigned to x, the following conversion is performed in the modulation table of Table 2.

| Data Pattern | Code Pattern |
|---|---|
| 0011 | 010 100 |

The codeword strings are subjected to NRZI modulation, and thereby the following level code strings are generated.

| Data Pattern | Code Pattern | Level Code String |
|---|---|---|
| 0010 | 010 000 | 011111 |
| 0011 | 010 100 | 011000 |

The last three bits of these level code strings are in inverted relation to each other. This means that DSV control can be performed also in a data string by selecting (1) and (0) as the DSV control bit x.

Considering redundancy due to DSV control, performing DSV control with one bit in a data string is equivalent to performing DSV control with 1.5 channel bits when expressed in terms of a channel bit string on the basis of the conversion rate (m:n=2:3) of Table 2. On the other hand, to perform DSV control in an RLL(1, 7) table such as Table 1, DSV control needs to be performed in a channel bit string. At this time, at least two channel bits may be required to keep the minimum run, and redundancy is increased as compared with the DSV control of Table 2. In other words, with the table structure of Table 2, DSV control is performed in a data string, and therefore DSV control can be performed efficiently.

The modulation table of Table 2 ready for high recording densities which table has the minimum run and the maximum run (d, k)=(1, 7) as described above is employed as a format of Blu-ray Disc ReWritable ver1.0 (registered trademark) as a high-density optical disk system, for example.

For still higher recording densities in the future, or specifically, for example, for still higher density standards for high-density optical disks, a more stable system is desired in a modulation system.

When a modulation system for implementing a more stable system with similar parameters and the configuration of a similar modulation table to those of the (1, 7)PP code in the past is realized for the already commercialized Blu-ray Disc ReWritable ver1.0, design technology in the past can be used, and thus a design risk at the time of hardware design can be reduced.

As described above, when RLL codes are recorded and reproduced at a high linear density, a long error tends to occur at a pattern where the minimum run d occurs successively. In addition, to perform DSV control in (1, 7; 2, 3) codes, redundant bits needs to be inserted, and the redundant bits needs to be reduced as much as possible. Then, in an RLL code (d, k; m, n)=(1, 7; 2, 3) with a minimum run d=1 which code was developed in view of such a situation, a modulation system is desired which generates a more stable code string than 1,7PP codes, which have for example features of limiting the number of successive occurrences of the minimum run and enabling DSV control to be performed with efficient control bits while the minimum run and the maximum run are kept. Specifically, a modulation system is desired which further reduces occurrences of errors caused by an edge shift, for example.

Further, a similar table configuration to that of the 1,7PP code in the past is desired in consideration of hardware design.

SUMMARY

The present embodiments have been made in view of the above, and it is desirable to make a basic configuration similar to that of the 1,7PP code, make the number of successive occurrences of the minimum run smaller than the one in the past, and prevent occurrence of a long error at times of recording and reproduction.

An embodiment is a modulation table configured to convert data having a basic data length of m bits into variable length code (d, k; m, n; r) (a maximum constraint length r>1) having a minimum run of d (d>0), a maximum run of k, and a basic codeword length of n bits, the modulation table including: a basic table configured to convert data patterns composed of basic data having a basic data length of m bits into code patterns composed of basic codes of variable length code having a basic codeword length of n bits; and a substitution table configured to replace data patterns composed of substitution data with code patterns composed of substitution codes; wherein the substitution table includes data patterns composed of minimum run successive occurrence limiting data limiting successive occurrences of the minimum run to a maximum of N (N>1) times and code patterns composed of substitution codes corresponding to the minimum run successive occurrence limiting data, and at least one of the substitution codes corresponding to the minimum run successive occurrence limiting data includes an indeterminate code a value of which is determined by one of an immediately preceding codeword string and an immediately succeeding codeword string.

When successive occurrences of the minimum run are limited at d=1, the substitution code can include a codeword "$0$" including the indeterminate code "$" which is "0" when three immediately preceding codes are "010", and is "1" when the three immediately preceding codes are not "010".

The indeterminate code "$" can further be set to "0" when an immediately preceding code is "1".

A first piece of minimum run successive occurrence limiting data of a plurality of pieces of the minimum run successive occurrence limiting data can form a part of a second piece of minimum run successive occurrence limiting data, and when the first piece of minimum run successive occurrence limiting data starts at a midpoint and next three codes are "010", the second piece of minimum run successive occurrence limiting data can be converted into individual codewords, and when the next three codes are not "010", a whole of the second piece of minimum run successive occurrence limiting data can be converted en bloc into substitution codes including the indeterminate code.

When the next three codes are "010", a whole of the first piece of minimum run successive occurrence limiting data can be converted en bloc into substitution codes not including the indeterminate code.

The N times that the minimum run occurs successively can be five times or less.

In the above-described embodiment, minimum run successive occurrence limiting data limiting successive occurrences of the minimum run to a maximum of N (N>1) times is replaced with substitution codes corresponding to the minimum run successive occurrence limiting data. At least one of the substitution codes corresponding to the minimum run successive occurrence limiting data is a code pattern including an indeterminate code a value of which is determined by one of an immediately preceding codeword string and an immediately succeeding codeword string.

Another embodiment is a modulating device for converting data having a basic data length of m bits into variable length code (d, k; m, n; r) (a maximum constraint length r>1) having a minimum run of d, a maximum run of k, and a basic codeword length of n bits, the modulating device including: data converting means configured to convert input data into code according to a conversion table describing correspondences between data patterns and code patterns; wherein the conversion table includes a first table for converting data patterns composed of basic data having a basic data length of m bits into code patterns composed of basic codes of variable length code having a basic codeword length of n bits, and a second table for replacing data patterns composed of substitution data with code patterns composed of substitution codes, the second table includes data patterns composed of minimum run successive occurrence limiting data limiting successive occurrences of the minimum run to a maximum of N (N>1) times and code patterns composed of substitution codes corresponding to the minimum run successive occurrence limiting data, and at least one of the substitution codes corresponding to the minimum run successive occurrence limiting data includes an indeterminate code a value of which is determined by one of an immediately preceding codeword string and an immediately succeeding codeword string.

The data converting means can include: first converting means configured to convert input data into a code pattern so as to keep an RLL rule according to the first conversion table; second converting means configured to convert input data into a code pattern according to the second conversion table such that successive occurrences of the minimum run are limited to the maximum of N times when the input data matches the minimum run successive occurrence limiting data, and determining the indeterminate code; and selecting means configured to select one of the code pattern in which the indeterminate code is determined and the code pattern converted according to the conversion table described in a fixed manner.

The modulating device can further include: RLL information generating means configured to generate information for keeping the RLL rule; and limiting information generating means configured to generate information for limiting successive occurrences of the minimum run to the maximum of N times; wherein the second converting means can determine the indeterminate code on a basis of the generated information for keeping the RLL rule and the generated information for limiting successive occurrences of the minimum run to the maximum of N times.

The modulating device can further include: first detecting means configured to detect that a first piece of minimum run successive occurrence limiting data of a plurality of pieces of the minimum run successive occurrence limiting data starts at a midpoint of a data string and next three codes are "010"; and second detecting means configured to detect a second piece of minimum run successive occurrence limiting data including the first piece of minimum run successive occurrence limiting data as a part of the second piece of minimum run successive occurrence limiting data; wherein when the first piece of minimum run successive occurrence limiting data starts at a midpoint of a data string and the next three codes are "010", the selecting means can convert the second piece of minimum run successive occurrence limiting data into individual codewords, and when the next three codes are not "010", the selecting means can convert a whole of the second piece of minimum run successive occurrence limiting data en bloc into substitution codes including the indeterminate code.

When the three codes next to the first piece of minimum run successive occurrence limiting data are "010", the selecting means can convert a whole of the first piece of minimum run successive occurrence limiting data en bloc into a code pattern not including the indeterminate code.

The modulating device can further include storage means configured to store at least 15-bit data of the input data.

The data converting means can limit the successive occurrences of the minimum run to a maximum of five times.

A signal modulated by the modulating device can be recorded onto a recording medium.

Another embodiment is a modulating method, a program, or a recording medium on which the program is recorded for converting data having a basic data length of m bits into variable length code (d, k; m, n; r) (a maximum constraint length r>1) having a minimum run of d, a maximum run of k, and a basic codeword length of n bits, the modulating method or the program including the step of: converting input data into code according to a conversion table describing correspondences between data patterns and code patterns; wherein the conversion table includes a first table for converting data patterns composed of basic data having a basic data length of m bits into code patterns composed of basic codes of variable length code having a basic codeword length of n bits, and a second table for replacing data patterns composed of substitution data with code patterns composed of substitution codes, the second table includes data patterns composed of minimum run successive occurrence limiting data limiting successive occurrences of the minimum run to a maximum of N (N>1) times and code patterns composed of substitution codes corresponding to the minimum run successive occurrence limiting data, and at least one of the substitution codes corresponding to the minimum run successive occurrence limiting data includes an indeterminate code a value of which is determined by one of an immediately preceding codeword string and an immediately succeeding codeword string.

In the above-described embodiment, input data is converted into code according to a conversion table describing correspondences between data patterns and code patterns. The conversion table includes a first table and a second table. The second table includes data patterns composed of minimum run successive occurrence limiting data limiting successive occurrences of the minimum run to a maximum of N (N>1) times and code patterns composed of substitution codes corresponding to the minimum run successive occurrence limiting data. At least one of the substitution codes corresponding to the minimum run successive occurrence limiting data includes an indeterminate code a value of which is determined by one of an immediately preceding codeword string and an immediately succeeding codeword string.

According to the above-described embodiments of the present invention, it is possible to further reduce successive occurrences of the minimum run, and further reduce error propagation at times of recording and reproduction of data.

Additional features and advantages are described herein, and will be apparent from, the following Detailed Description and the figures.

BRIEF DESCRIPTION OF THE FIGURES

FIG. 21 is a diagram of assistance in explaining data formats of the modulating device in FIG. 20.

DETAILED DESCRIPTION

Embodiments are hereinafter described. Correspondence between constitutional requirements of the present invention and embodiments described in the specification or the drawings are illustrated as follows.

An embodiment is a modulation table (for example a modulation table of Table 3) for converting data having a basic data length of m bits into variable length code (d, k; m, n; r) (a maximum constraint length r>1) having a minimum run of d (d>0), a maximum run of k, and a basic codeword length of n bits, the modulation table including: a basic table (for example a part from a data pattern (11) to a data pattern (000000) on an upper side of Table 3) for converting data patterns (for example the data patterns (11) to (000000) on a left side of Table 3) composed of basic data having a basic data length of m bits into code patterns (for example code patterns (*0*) to (010100000) on a right side of Table 3) composed of basic codes of variable length code having a basic codeword length of n bits; and a substitution table (for example a part from a data pattern (00001000) to a data pattern (1001110111 (next "010")) on a lower side of Table 3) for replacing data patterns (for example the data patterns (00001000) to (1001110111 (next "010")) on the left side of Table 3) composed of substitution data with code patterns (for example code patterns (000100100100) to (001 (no-change)) on the right side of Table 3) composed of substitution codes; wherein the substitution table includes data patterns (for example data patterns (110111), (1001110111), and (1001110111 (next "010")) in Table 3) composed of minimum run successive occurrence limiting data limiting successive occurrences of the minimum run to a maximum of N (N>1) times and code patterns (for example code patterns "001 000 000", "$0$ 010 000 000 101", and "001 (no-change)" in Table 3) composed of substitution codes corresponding to the minimum run successive occurrence limiting data, and at least one of the substitution codes corresponding to the minimum run successive occurrence limiting data includes an indeterminate code (for example "$" in Table 3) a value of which is determined by one of an immediately preceding codeword string and an immediately succeeding codeword string.

Figure 12:
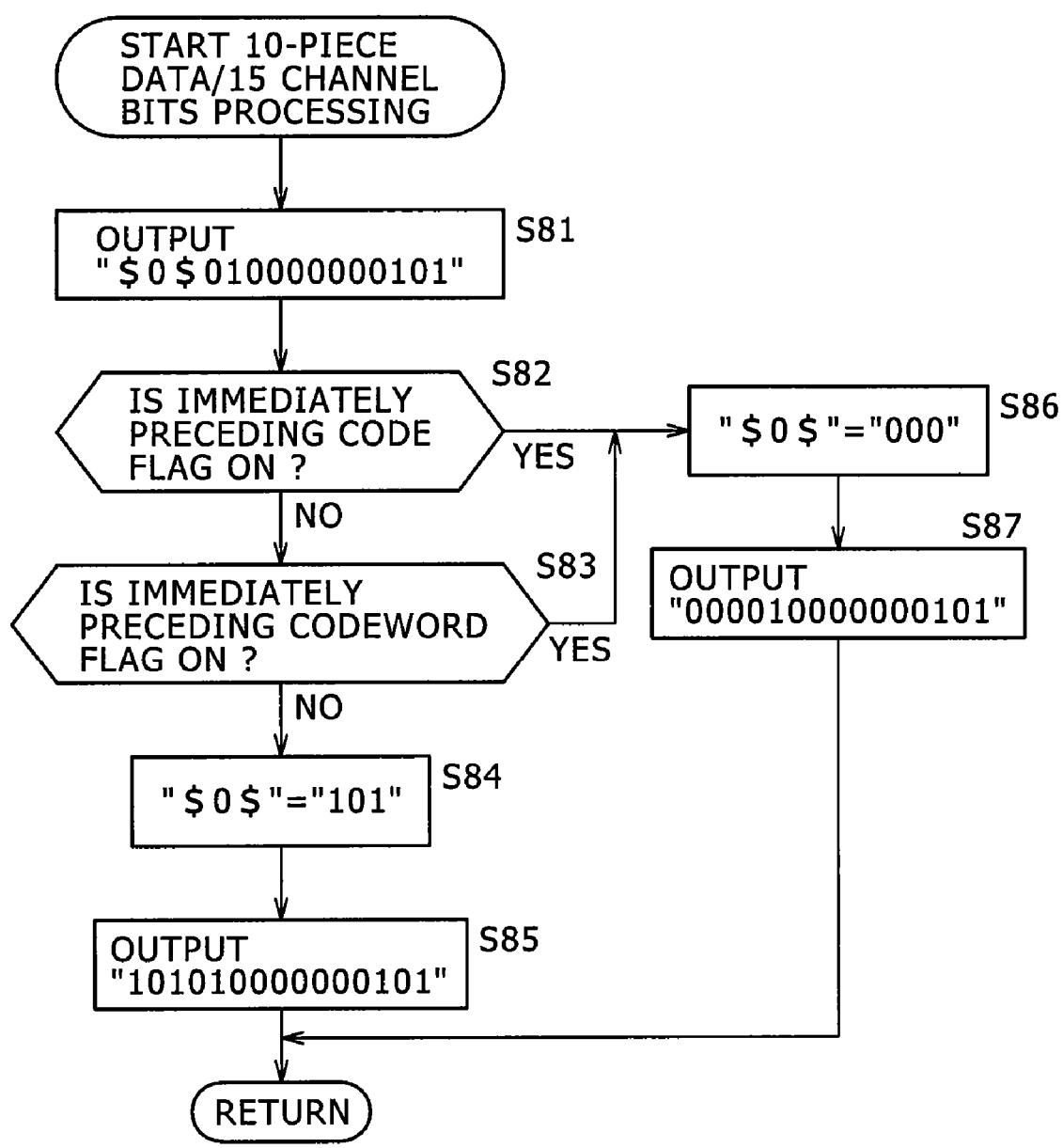
FIG. 12 is a flowchart of assistance in explaining 10-piece data/15 channel bits processing in step S54 in FIG. 11.

When successive occurrences of the minimum run are limited at d=1, the substitution code can include a codeword "$0$" including the indeterminate code "$" which is "0" (for example step S86 in FIG. 12) when three immediately preceding codes are "010" (for example when it is determined that an immediately preceding codeword flag is on in step S83 in FIG. 12), and is "1" (for example step S84 in FIG. 12) when the three immediately preceding codes are not "010" (for example when it is determined that the immediately preceding codeword flag is not on in step S83 in FIG. 12).

The indeterminate code "$" can further be set to "0" (for example step S86 in FIG. 12) when an immediately preceding code is "1" (for example when it is determined that an immediately preceding code flag is on in step S82 in FIG. 12).

Figure 10:
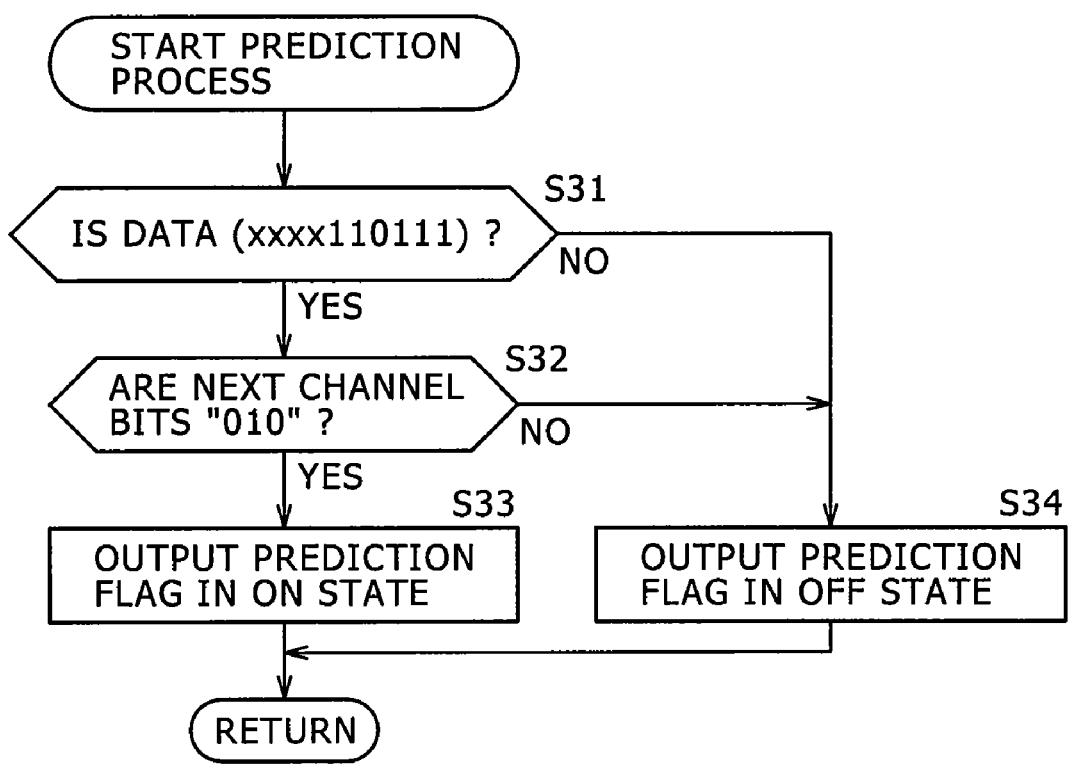
FIG. 10 is a flowchart of assistance in explaining a prediction process in step S3 in FIG. 9.
Figure 11:
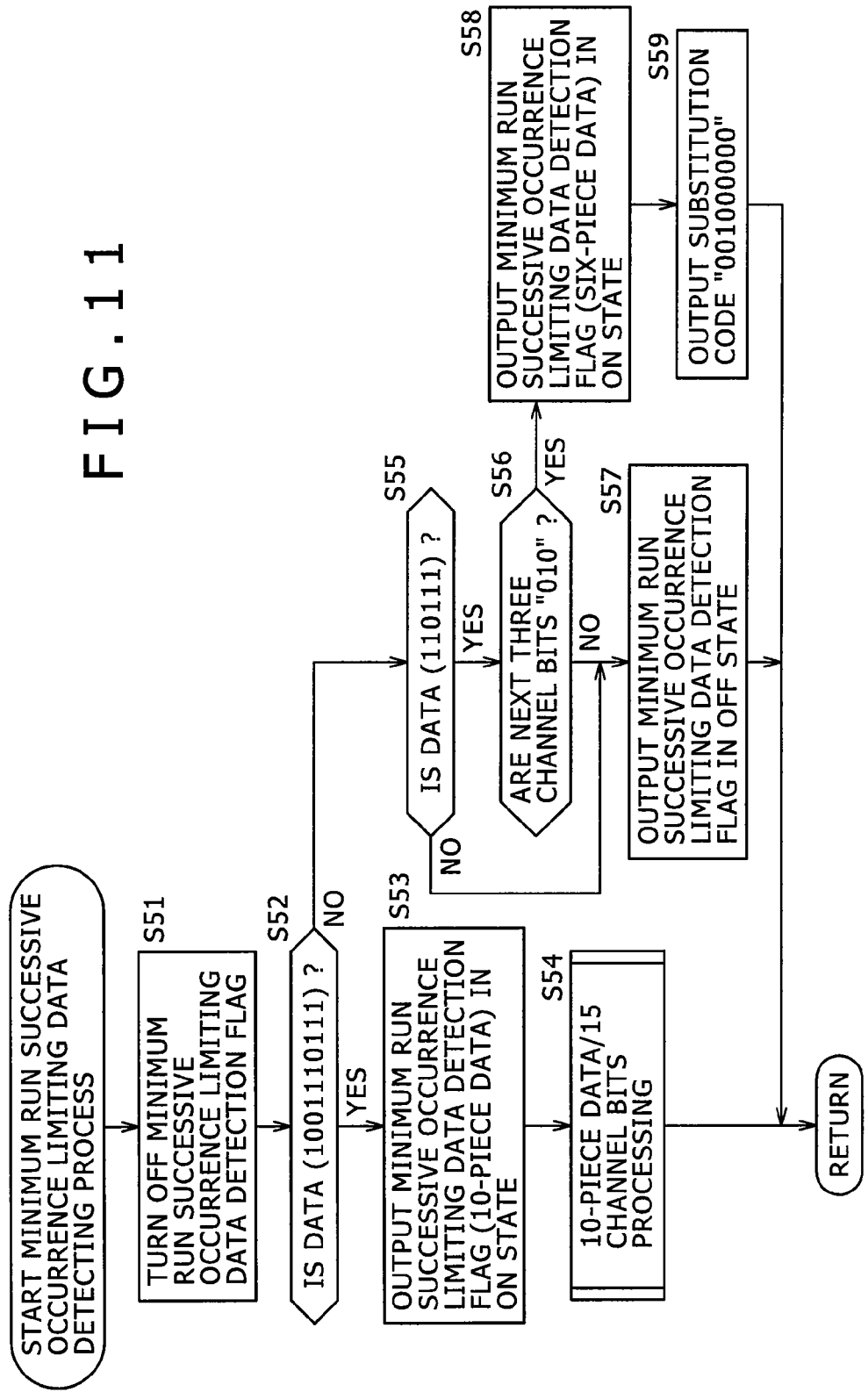
FIG. 11 is a flowchart of assistance in explaining a minimum run successive occurrence limiting data detecting process in step S4 in FIG. 9.
Figure 17:
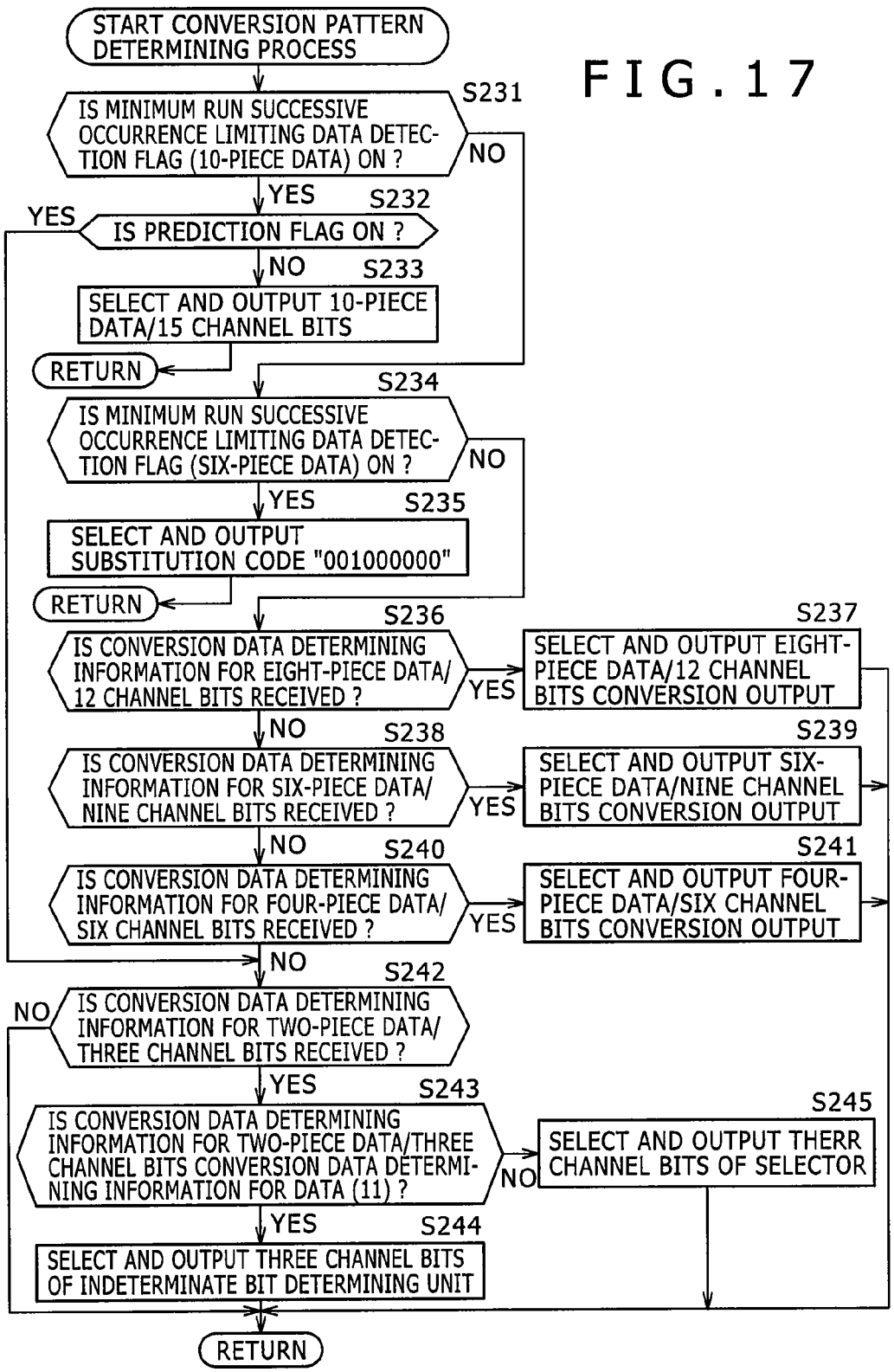
FIG. 17 is a flowchart of assistance in explaining a conversion pattern determining process in step S6 in FIG. 9.

A first piece of minimum run successive occurrence limiting data (for example the data pattern (110111) in Table 3) of a plurality of pieces of the minimum run successive occurrence limiting data can form a part of a second piece of minimum run successive occurrence limiting data (for example the data pattern (1001110111) in Table 3), and when the first piece of minimum run successive occurrence limiting data starts at a midpoint of the second piece of minimum run successive occurrence limiting data and next three codes are "010" (for example it is determined in step S232 in FIG. 17 that a prediction flag has been turned on in step S33 in FIG. 10), the second piece of minimum run successive occurrence limiting data can be converted into individual codewords (for example in steps S242 to S245 in FIG. 17), and when the next three codes are not "010" (for example it is determined in step S232 in FIG. 17 that the prediction flag has been turned off in step S34 in FIG. 10), a whole of the second piece of minimum run successive occurrence limiting data can be converted en bloc into substitution codes (for example the code pattern "$0$ 010 000 000 101") including the indeterminate code (for example in steps S53 and S54 in FIG. 11, step S81 in FIG. 12, and steps S232 and S233 in FIG. 17).

Figure 1:
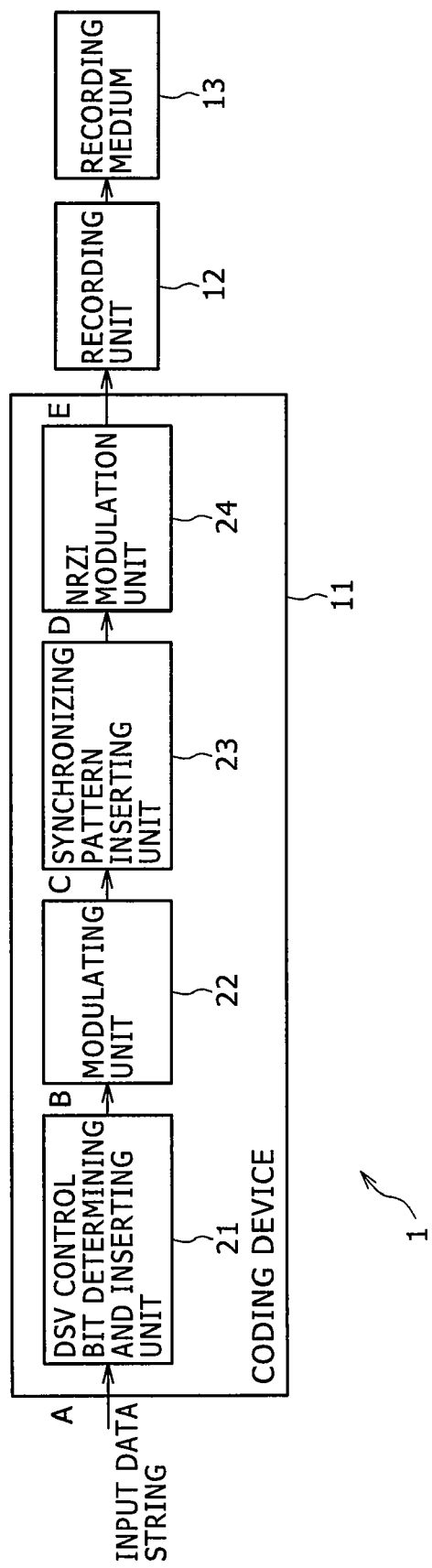
FIG. 1 is a block diagram showing a configuration of a modulating device according to an embodiment.

When the next three codes are "010" (for example it is determined in step S234 in FIG. 17 that a minimum run successive occurrence limiting data flag (six-piece data) has been turned on in step S58 in FIG. 11), a whole of the first piece of minimum run successive occurrence limiting data can be converted en bloc into substitution codes (for example the code pattern "001 000 000") not including the indeterminate code (for example in step S59 in FIG. 1, step S81 in FIG. 12, and steps S234 and S235 in FIG. 17).

Another embodiment is a modulating device (for example a modulating device 1 in FIG. 1) for converting data having a basic data length of m bits into variable length code (d, k; m, n; r) (a maximum constraint length r>1) having a minimum run of d, a maximum run of k, and a basic codeword length of n bits, the modulating device including: data converting means (for example a data converting unit 60 in FIG. 3) configured to convert input data into code according to a modulation table describing correspondences between data patterns and code patterns; wherein the modulation table (for example a modulation table of Table 3) includes a first table (for example a part from a data pattern (11) to a data pattern (000000) on an upper side of Table 3) for converting data patterns (for example the data patterns (11) to (000000) on a left side of Table 3) composed of basic data having a basic data length of m bits into code patterns (for example code patterns (*0*) to (010100000) on a right side of Table 3) composed of basic codes of variable length code having a basic codeword length of n bits, and a second table (for example a part from a data pattern (00001000) to a data pattern (1001110111 (next "010")) on a lower side of Table 3) for replacing data patterns (for example the data patterns (00001000) to (1001110111 (next "010")) on the left side of Table 3) composed of substitution data with code patterns (000100100100) to (001 (no-change)) on the right side of Table 3) composed of substitution codes, the second table includes data patterns (for example data patterns (110111), (1001110111), and (1001110111 (next "010")) in Table 3) composed of minimum run successive occurrence limiting data limiting successive occurrences of the minimum run to a maximum of N (N>1) times and code patterns (for example code patterns "001 000 000", "$0$ 010 000 000 101", and "001 (no-change)" in Table 3) composed of substitution codes corresponding to the minimum run successive occurrence limiting data, and at least one of the substitution codes corresponding to the minimum run successive occurrence limiting data includes an indeterminate code (for example "$" in Table 3) a value of which is determined by one of an immediately preceding codeword string and an immediately succeeding codeword string.

Figure 3:
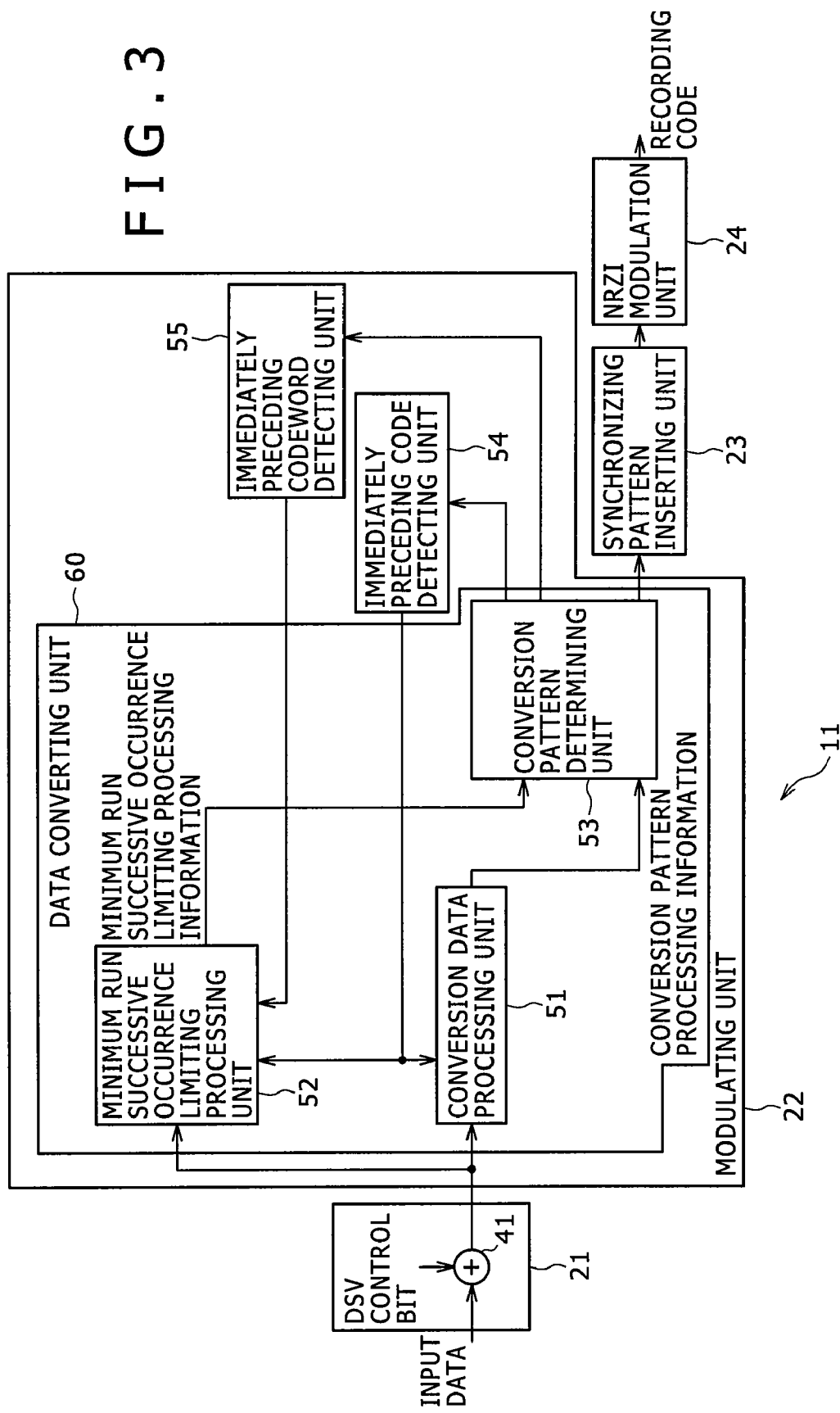
FIG. 3 is a block diagram showing a more detailed configuration of main parts of a coding device in FIG. 1.

The data converting means can include: first converting means (for example a conversion data processing unit 51 in FIG. 3) configured to convert input data into a code pattern so as to keep an RLL rule according to the first conversion table; second converting means (for example a minimum run successive occurrence limiting processing unit 52 in FIG. 3) configured to convert input data into a code pattern according to the second conversion table such that successive occurrences of the minimum run are limited to the maximum of N times when the input data matches the minimum run successive occurrence limiting data, and determining the indeterminate code; and selecting means (for example a conversion pattern determining unit 53 in FIG. 3) configured to select one of the code pattern in which the indeterminate code is determined and the code pattern converted according to the conversion table described in a fixed manner.

The modulating device can further include: RLL information generating means (for example an immediately preceding code detecting unit 54 in FIG. 4 performing the process of steps S171 to S173 in FIG. 15) configured to generate information (for example an immediately preceding code flag that is on when an immediately preceding channel bit string is "1" and is off when the immediately preceding channel bit string is "0") for keeping the RLL rule; and limiting information generating means (for example an immediately preceding codeword detecting unit 55 in FIG. 4 performing the process of steps S201 to S203 in FIG. 16) configured to generate information (an immediately preceding codeword flag that is on when three immediately preceding channel bits are "010" and is off when the three immediately preceding channel bits are not "010") for limiting successive occurrences of the minimum run to the maximum of N times; wherein the second converting means determines the indeterminate code on a basis of the generated information for keeping the RLL rule and the generated information for limiting successive occurrences of the minimum run to the maximum of N times (for example the processes of steps S82, S83, S84 and S86 in FIG. 12).

Figure 4:
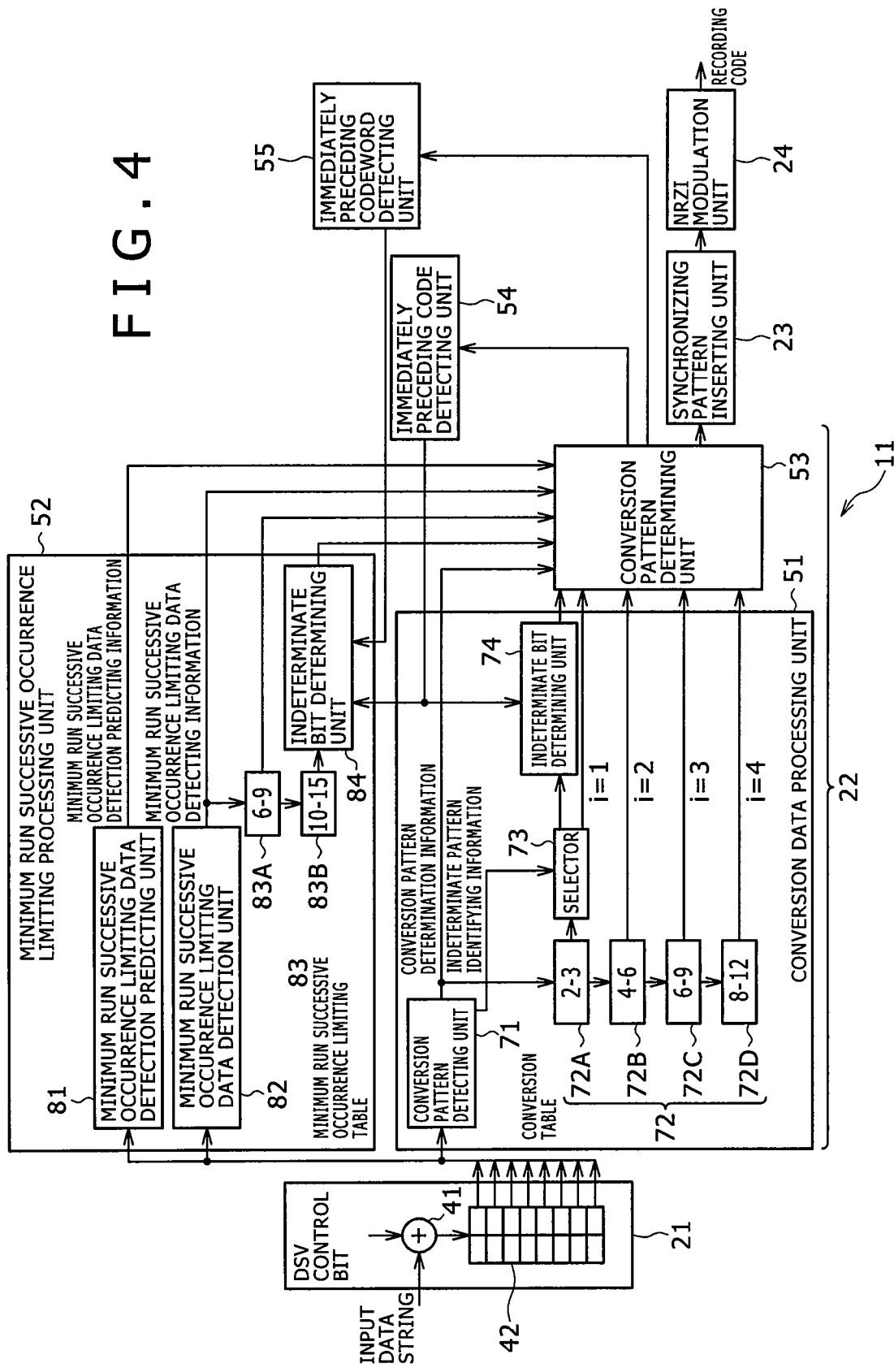
FIG. 4 is a block diagram showing a still more detailed configuration of main parts of the coding device of FIG. 3.

The modulating device can further include: first detecting means (for example a minimum run successive occurrence limiting data detection predicting unit 81 in FIG. 4 that performs a determination process of step S31 in FIG. 10 and outputs a prediction flag in an on state in step S33) configured to detect that a first piece of minimum run successive occurrence limiting data (for example the data pattern (110111) in Table 3) of a plurality of pieces of the minimum run successive occurrence limiting data starts at a midpoint of a data string and next three codes are "010"; and second detecting means (for example a minimum run successive occurrence limiting data detecting unit 82 in FIG. 4) configured to detect a second piece of minimum run successive occurrence limiting data (for example the data pattern (1001110111) in Table 3) including the first piece of minimum run successive occurrence limiting data (for example the data pattern (110111)) as a part of the second piece of minimum run successive occurrence limiting data (for example in step S52 in FIG. 1); wherein when the first piece of minimum run successive occurrence limiting data (for example the data pattern (110111) in Table 3) starts at a midpoint of a data string and the next three codes are "010" (for example it is determined in step S232 in FIG. 17 that the prediction flag has been turned on), the selecting means converts the second piece of minimum run successive occurrence limiting data into individual codewords (for example in steps S242 to S245 in FIG. 17), and when the next three codes are not "010" (for example it is determined in step S232 in FIG. 17 that the prediction flag has been turned off in step S34 in FIG. 10), the selecting means converts a whole of the second piece of minimum run successive occurrence limiting data en bloc into substitution codes (for example the code pattern "$0$ 010 000 000 101") including the indeterminate code (for example in steps S53 and S54 in FIG. 11, step S81 in FIG. 12, and steps S232 and S233 in FIG. 17).

When the three codes next to the first piece of minimum run successive occurrence limiting data are "010" (for example it is determined in step S234 in FIG. 17 that a minimum run successive occurrence limiting data flag (six-piece data) has been turned on in step S58 in FIG. 11), the selecting means can convert a whole of the first piece of minimum run successive occurrence limiting data en bloc into code patterns (for example the code pattern "001 000 000") not including the indeterminate code (for example in step S59 in FIG. 11 and steps S234 and S235 in FIG. 17).

The modulating device can further include storage means (for example a shift register 42 in FIG. 4) configured to store at least 15-bit data of the input data.

A signal modulated by the modulating device (for example a modulating device 1 in FIG. 1) can be recorded onto a recording medium (for example a recording medium 13 in FIG. 1).

Another embodiment is a modulating method (for example a modulating method of a modulating device 1 in FIG. 1) for converting data having a basic data length of m bits into variable length code (d, k; m, n; r) (a maximum constraint length r>1) having a minimum run of d, a maximum run of k, and a basic codeword length of n bits, the modulating method including: a data converting step (for example steps S3 to S6 in FIG. 9) of converting input data into code according to a modulation table describing correspondences between data patterns and code patterns; wherein the modulation table (for example a modulation table of Table 3) includes a first table (for example a part from a data pattern (11) to a data pattern (000000) on an upper side of Table 3) for converting data patterns (for example the data patterns (11) to (000000) on a left side of Table 3) composed of basic data having a basic data length of m bits into code patterns (for example code patterns (*0*) to (010100000) on a right side of Table 3) composed of basic codes of variable length code having a basic codeword length of n bits, and a second table (for example a part from a data pattern (00001000) to a data pattern (1001110111 (next "010")) on a lower side of Table 3) for replacing data patterns (for example the data patterns (00001000) to (1001110111 (next "010")) on the left side of Table 3)

composed of substitution data with code patterns (for example code patterns (000100100100) to (001 (no-change)) on the right side of Table 3) composed of substitution codes, the second table includes data patterns (for example data patterns (110111), (1001110111), and (1001110111 (next "010")) in Table 3) composed of minimum run successive occurrence limiting data limiting successive occurrences of the minimum run to a maximum of N (N>1) times and code patterns (for example code patterns "001 000 000", "$0$ 010 000 000 101", and "001 (no-change)" in Table 3) composed of substitution codes corresponding to the minimum run successive occurrence limiting data, and at least one of the substitution codes corresponding to the minimum run successive occurrence limiting data includes an indeterminate code (for example "$" in Table 3) a value of which is determined by one of an immediately preceding codeword string and an immediately succeeding codeword string.

Embodiments are hereinafter be described with reference to the drawings. Hereinafter, a data string before conversion will be represented in parentheses as in (000011), and a channel bit string (code string) after conversion will be represented in quotation marks as in "000 100 100". In the present specification, a 1,7PP code (PP: Parity-preserve Prohibit-repeated-minimum-transition-runlength) is a variable length code with a minimum run d=1, a maximum run k=7, and a conversion rate (m:n)=(2:3), and further refers to a code having a modulation table (conversion table) for performing perfect DSV control with efficient DSV control bits while limiting the number of successive occurrences of the minimum run and keeping the minimum run and the maximum run.

The following Table 3 represents a modulation table according to an embodiment.

TABLE 3

| 1, 7PP-rmtr5_code. rev.1<br>1, 7PP-rmtr5_ver.1 | RLL(1, 7; 2, 3; 5) |
|---|---|
| Data Pattern | Code Pattern |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 00001000 | 000 100 100 100 |
| 00000000 | 010 100 100 100 |
| 110111 (next "010") | 001 000 000 |
| 1001110111 | $0$ 010 000 000 101 |
| 1001110111 (next "010") | 001 (no-change) |
| if xx1 then *0* = 000 | |
| xx0 then *0* = 101 | |
| if x10 or x01 then $0$ = 000 | |
| x00 | $0$ = 101 |
| Sync & Termination | |
| #01 010 000 000 010 000 000 010 (24 cbits) | |
| # = 0 not terminate case | |
| # = 1 terminate case | |
| Termination Table | |
| 00 | 000 |
| 0000 | 010 100 |

Incidentally, the code pattern "001" (no-change) denotes that the data pattern (1001110111) is not converted en bloc, that is, the data pattern (1001110111) is divided into separate pieces of data and then the separate pieces of data are each converted. Specifically, the first data (10) of the data pattern (1001110111) is converted into "001" in a first conversion process. In a next conversion process, next data (01) is converted into "010". Further, next data (110111) (next "010") is converted into "001 000 000", "001" in "001" (no-change) represents the codeword resulting from the first conversion.

As with the modulation tables of Table 1 and Table 2, the modulation table of Table 3 includes conversion patterns composed of data patterns and code patterns. When a modulating device performs modulation according to the modulation table of Table 3, and a data string input to the modulating device matches a data pattern described in Table 3, the part of the data string which part matches the data pattern is converted into a corresponding code pattern, and the code pattern is then output as a codeword string.

The modulation table of Table 3 is a 1,7PP code, and has a basic composition similar to that of Table 2. The modulation table of Table 3 is formed by a basic table, a substitution table, and a termination table.

The basic table includes conversion patterns (basic patterns), without which conversion processing cannot be carried out. The substitution table includes conversion patterns (substitution patterns), without which conversion processing can be carried out, but with which more effective conversion processing (limiting the maximum run and limiting successive occurrences of a minimum run) can be carried out. The termination table includes conversion patterns (terminating patterns) for terminating a code at an arbitrary position.

Specifically, in the modulation table shown in Table 3, a modulation table as the basic table is a part formed by conversion patterns (basic patterns) including basic data patterns composed of data patterns (11) to (000000) and basic code patterns composed of code patterns "*0*" to "010 100 000" corresponding to the data patterns. A modulation table as the substitution table is a part formed by conversion patterns (substitution patterns) including substitution data patterns composed of data patterns (00001000), (00000000), (110111) (next "010"), (1001110111), and (1001110111) (next "010") and substitution code patterns composed of code patterns "000 100 100 100", "010 100 100 100", "001 000 000", "$0$ 010 000 000 101", and "001" (no-change) corresponding to the data patterns.

A part of the substitution table which part includes the substitution data patterns composed of the data patterns (00001000) and (00000000) and the substitution code patterns composed of the code patterns "000 100 100 100" and "010 100 100 100" corresponding to the data patterns is a table of substitution patterns for limiting the maximum run. A part of the substitution table which part includes the substitution data patterns composed of the data patterns (110111) (next "010"), (1001110111), and (1001110111) (next "010") and the substitution code patterns composed of the code patterns "001 000 000", "$0$ 010 000 000 101", and "001" (no-change) corresponding to the data patterns is a table of substitution patterns for limiting successive occurrences of the minimum run (minimum run successive occurrence limiting patterns).

A modulation table as the termination table is a part formed by conversion patterns (termination patterns) including termination data patterns composed of data patterns (00) and (0000) and termination code patterns composed of code patterns "000" to "010 100" corresponding to the data patterns.

The data patterns (11) to (00000000) are fixedly converted into the corresponding code patterns "*0*" to "010 100 100 100" regardless of a condition. In this sense, these conversion patterns will hereinafter be described also as fixed conversion patterns.

On the other hand, while the whole of the data patterns (110111) and (1001110111) is converted en bloc into the code patterns "001 000 000" and "$0$ 010 000 000 101" depending on a condition, the whole of the data patterns is not converted en bloc, the data patterns are resolved into individual data patterns (fixed conversion patterns), and each of the individual data patterns is converted into a corresponding code pattern, depending on a condition. In this sense, these conversion patterns will hereinafter be described also as conditional conversion patterns.

A modulation table describes correspondences between data patterns and code patterns. A part of Table 3 will hereinafter be also described as a modulation table or a conversion table as needed.

Table 3 has a minimum run d=1, a maximum run k=7, and an indeterminate code (a code represented by a symbol *) as an element of a basic code. The indeterminate code is set to "0" or "1" so as to keep the minimum run d and the maximum run k. Specifically, in Table 3, when data to be converted matches the data pattern (11) (such a case will hereinafter be expressed in a simplified manner such as "when two-piece data to be converted is (11)", as needed), "000" or "101" is selected depending on an immediately preceding codeword string (channel bit string), and the data to be converted is converted to one of "000" and "101". For example, when one channel bit (code) of the immediately preceding codeword string is "1", the two-piece data (11) is converted to the codeword "000" to keep the minimum run d. When one channel bit of the immediately preceding codeword string is "0", the two-piece data (11) is converted to the codeword "101" to keep the maximum run k.

The modulation table of Table 3 has a variable length structure, and therefore the basic patterns include conversion patterns from i=1 to i=3.

In addition, the modulation table of Table 3 has substitution patterns for limiting successive occurrences of the minimum run d at a constraint length i=3. When a data string is (110111), an immediately succeeding codeword is further referred to. When the succeeding codeword string is "010", the six-piece data (110111) is replaced with a codeword "001 000 000". When the immediately succeeding codeword string is not "010" (when the immediately succeeding codeword string is "001", "101", or "000"), the data string is not converted en bloc, but is divided into units of two-piece data ((11), (01), and (11)) and then converted into a codeword. Thus, the data string is converted into a codeword "*0* 010 *0*", that is, a codeword "*0* 010 101".

Further, the modulation table of Table 3 separately has substitution patterns for limiting successive occurrences of the minimum run d at a constraint length i=5. When a data string is (1001110111), except for exceptional processing to be described later (processing when a succeeding codeword string is "010"), the data string of 10 bits is replaced with a codeword "$0$ 010 000 000 101". "$" in the codeword "$0$" is an indeterminate code for keeping the RLL rule and limiting successive occurrences of the minimum run to a predetermined number of times. Specifically, when one channel bit of an immediately preceding codeword string is "1", the codeword "$0$" is converted to a codeword "000" so as to keep the minimum run. When one channel bit of the immediately preceding codeword string is "0", on the other hand, to keep the maximum run and limit successive occurrences of the minimum run to a predetermined number of times, the codeword "$0$" is converted to a codeword "000" when the three channel bits of the immediately preceding codeword string are "010", and is converted to a codeword "101" when the three channel bits of the immediately preceding codeword string are not "010".

While the indeterminate code $ is determined on the basis of the value of the immediately preceding code, the indeterminate code $ can be determined also by an immediately succeeding code depending on the position of the indeterminate code $.

Summarizing the above, another expression can be made as follows. When two channel bits of the immediately preceding codeword string are "10" or "01", the codeword "$0$" is replaced with a codeword "000". Otherwise, that is, when the two channel bits of the immediately preceding codeword string are "00", the codeword "$0$" is replaced with a codeword "101". Incidentally, although there are four patterns for two channel bits, the other pattern "11" does not satisfy the minimum run d=1, and is thus not defined as a conversion pattern.

The exceptional processing is as follows. When a data string is (1001110111), an immediately succeeding codeword is further referred to. When the succeeding codeword string is "010", en bloc replacement processing as described above is not performed, and only the first two bits (10) is converted to a codeword "001". Thereafter, the two bits (01) is converted to a codeword "010" in a next process, and the six bits (110111) (next "010") is converted to "001 000 000" in a next process.

Thus, successive occurrences of the minimum run in a codeword string resulting from the conversion of data is limited, and the minimum run is repeated, a maximum of 5 times.

The modulation table of Table 3 has substitution patterns (maximum run guaranteeing patterns) for realizing the maximum run k=7 in conversion patterns with a constraint length i=4. Specifically, the data pattern (00001000) is converted to the code pattern "000 100 100 100", and the data pattern (00000000) is converted to the code pattern "010 100 100 100". Incidentally, also in this case, the minimum run d=1 is kept.

Further, in Table 3, when termination is effected at an arbitrary position of a data string to insert a synchronizing pattern, and when the data string has (00) or (0000) at a terminating position, a termination pattern is used. The inserted synchronizing pattern has a first code as a termination pattern use identifying bit. When a termination pattern is used, the first code of the immediately succeeding substitution pattern string is "1". When no termination pattern is used, the first code is "0". Incidentally, the synchronizing pattern in Table 3 is formed such that the synchronizing pattern has the above-mentioned termination pattern use identifying bit and a codeword with k=8 exceeding the maximum run k=7, for detection of the synchronizing pattern, and such that a last code is "0". As shown in Table 3, for example, the synchronizing pattern is formed by a total of 24 codes (channel bits) with k=8 repeated twice.

The conversion patterns in Table 3 have a conversion rule that a remainder when the number of "1"s as an element of a data pattern is divided by two and a remainder when the number of "1"s as an element of a code pattern is divided by two be both 1 or 0 and thus equal to each other (both the conversion patterns corresponding to each other have an odd number of "1"s or an even number of "1"s). For example, the data pattern (000001) of the conversion patterns corresponds to the code pattern "010 100 100". The number of "1"s as an element of the data pattern is one, and the number of "1"s as an element of the corresponding code pattern is three. A remainder when the number of "1"s as an element of the data pattern is divided by two and a remainder when the number of "1"s as an element of the code pattern is divided by two are both one (an odd number) and thus match each other. Similarly, the data pattern (000000) of the conversion patterns corresponds to the code pattern "010 100 000". The number of "1"s as an element of the data pattern is zero, and the number of "1"s as an element of the corresponding code pattern is two. A remainder when the number of "1"s as an element of the data pattern is divided by two and a remainder when the number of "1"s as an element of the code pattern is divided by two are both zero (an even number) and thus match each other.

In the result, DSV polarity is preserved in the data strings and the channel bit strings of the respective conversion patterns. Therefore, when one DSV control bit is inserted as a redundant bit in a data string, and the DSV control bit is (1), polarity of a recording code string generated by converting the data string including the DSV control bit part to a channel bit string and subjecting the channel bit string to NRZI modulation is reversed. When the DSV control bit is (0), polarity of a recording code string generated by converting the data string including the DSV control bit part to a channel bit string and subjecting the channel bit string to NRZI modulation is not reversed. Hence, a modulation table in which DSV polarity is preserved as in Table 3 enables polarity after one bit inserted as a redundant bit in a data string is subjected to data conversion and NRZI modulation to be changed by the bit. DSV control can thus be performed in the data string.

Incidentally, a maximum data string to be referred to for conversion in Table 3 is a data string in the case of

| Data Pattern | Code Pattern |
| --- | --- |
| 1001110111 (next "010") | 001 (no-change) |

In order to determine from the data string whether a code pattern following the data pattern (1001110111) is "010", (00000) (five bits) is referred to at a maximum as the data string following (1001110111) (10 bits), and thus a total of 15 bits are referred to.

A configuration of a modulating device according to an embodiment will next be described with reference to drawings. FIG. 1 is a block diagram showing a general configuration of a modulating device 1 according to an embodiment. The modulating device 1 includes a coding device 11 for coding an input data string and outputting the result, and a recording unit 12 for recording the output of the coding device 11 onto a recording medium 13. The coding device 11 includes a DSV control bit determining and inserting unit 21, a modulating unit 22, a synchronizing pattern inserting unit 23, and an NRZI modulation unit 24.

The DSV control bit determining and inserting unit 21 performs DSV control on an input data string at arbitrary intervals according to a predetermined format. The DSV control bit determining and inserting unit 21 consequently determines and inserts "1" or "0" as a DSV control bit at arbitrary intervals. The modulating unit 22 modulates the data string having DSV control bits inserted therein. The synchronizing pattern inserting unit 23 inserts a synchronizing pattern at a predetermined position at a predetermined interval. The NRZI modulation unit 24 converts the data having the synchronizing pattern inserted therein to a recording code string (or converts the data into a transmission code string when the code string is to be output to a transmission line). The recording unit 12 records the recording code string input from the NRZI modulation unit 24 onto the recording medium 13 formed by for example an optical disk, a magnetic disk, or a magneto-optical disk. In addition, though not shown, a timing managing unit for generating a timing signal and supplying the timing signal to various parts to manage timing is provided.

Figure 2:
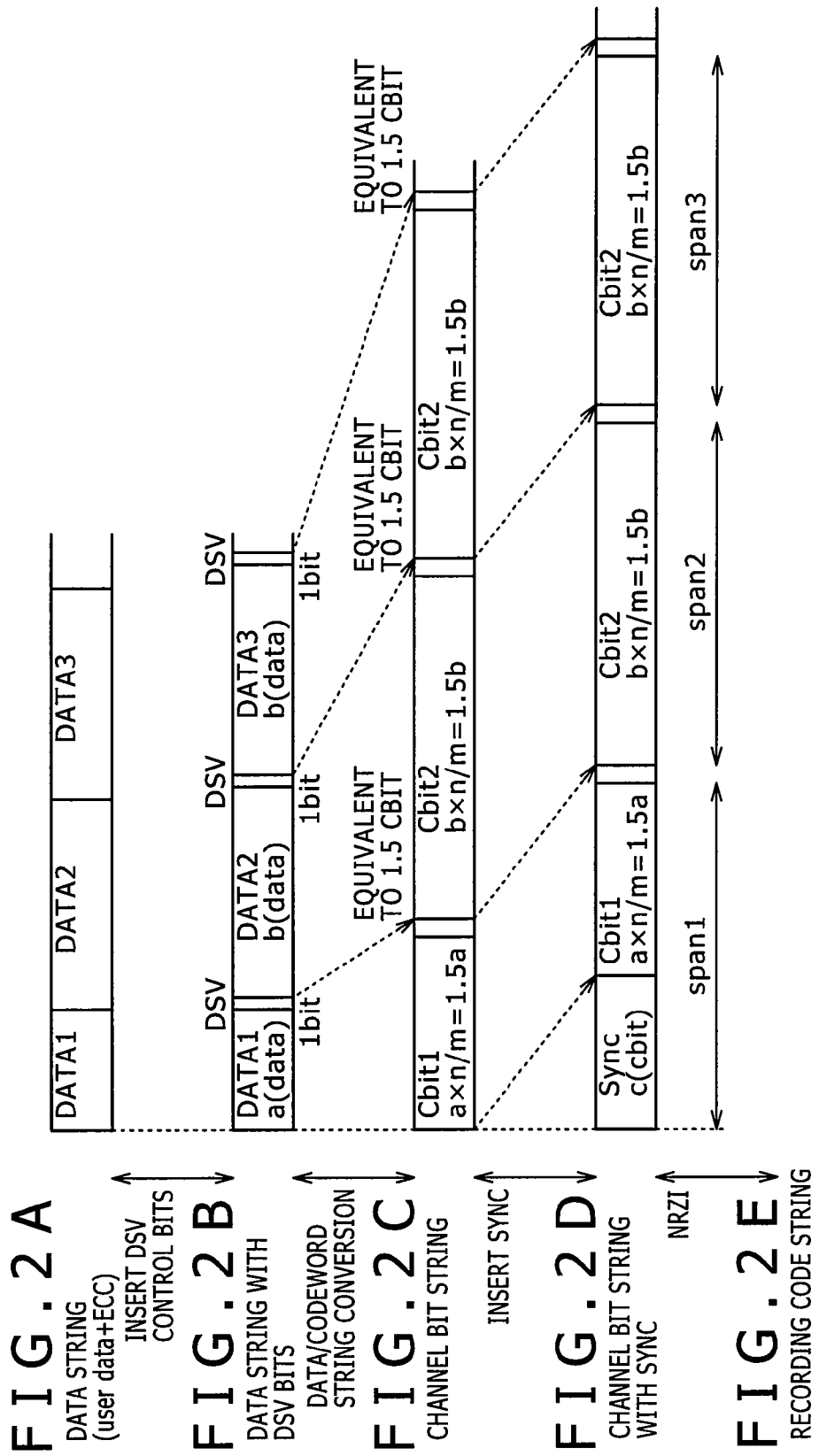
FIGS. 2A, 2B, 2C, 2D, and 2E are diagrams of assistance in explaining data formats.

FIGS. 2A, 2B, 2C, 2D, and 2E are diagrams of data formats of data input and output to parts of the modulating device 1, showing relations in inserting DSV control bits, including a synchronizing pattern. A data string (FIG. 2A) input from a device not shown in the figure to the DSV control bit determining and inserting unit 21 includes user data and information data such as ECC (Error-Correcting Code) and the like. The DSV control bit determining and inserting unit 21 inserts one bit as a DSV control bit at positions at predetermined intervals of the data string (FIG. 2B). A first section is set to a length different from that of other sections in advance with insertion of a sync SYNC (synchronizing pattern) as a precondition. Supposing that lengths of DSV sections (DATA 1, DATA 2, and DATA 3) in FIG. 2B are a data, b data, and b data, respectively, a converted cbit (channel bit) section of each of the DSV sections (DATA 1, DATA 2, and DATA 3) is (a×3/2)=(1.5a) or (b×3/2)=(1.5b) as a result of modulation by the modulating unit 22 using the modulation table (Table 3) with a conversion rate (m:n)=(2:3) (FIG. 2C). Thereafter, the synchronizing pattern inserting unit 23 inserts a sync SYNC at a predetermined position (a start position in front of the position of DATA 1 in FIG. 2D) (FIG. 2D). Letting c (cbit) be the number of channel bits of SYNC, the relation of the following Equation (1) holds between a, b, and c.

$$1.5a + c = 1.5b \quad (1)$$

When the relation holds, DSV control is performed at equal intervals even in a format including the synchronizing pattern.

A DSV control bit in FIG. 2B is equivalent to 1.5 channel bits in a channel bit string. That is, one bit is inserted as a DSV control bit in a data string, and is therefore increased by an amount corresponding to the conversion rate in terms of channel bits.

$$1 \text{ bit} \times n/m = 1 \times 3/2 = 1.5 \text{ channel bits} \quad (2)$$

Comparing this with a system in the past, for example, two channel bits are necessary to perform DSV control in channel bits while keeping the minimum run d=1. Alternatively, four channel bits are necessary to perform DSV control in channel bits while keeping both the minimum run and the maximum run. Thus, as compared with the DSV control system in the past, the insertion of DSV control bits in a data string by the present system can be performed with fewer redundant channel bits for DSV control.

A channel bit string having the synchronizing pattern inserted therein is subjected to NRZI modulation by the NRZI modulation unit 24 (FIG. 2E), and then supplied as a recording code string to the recording unit 12 to be recorded onto the recording medium 13.

FIG. 3 is a block diagram showing a more detailed configuration of main parts of the coding device 11. The DSV control bit determining and inserting unit 21 has an adder 41 for adding a DSV control bit to input data. The modulating unit 22 includes a conversion data processing unit 51, a minimum run successive occurrence limiting processing unit 52, a conversion pattern determining unit 53, an immediately preceding code detecting unit 54, and an immediately preceding codeword detecting unit 55. The conversion data processing unit 51, the minimum run successive occurrence limiting processing unit 52, and the conversion pattern determining unit 53 are blocks that actually have the modulation table (conversion table) of Table 3, and perform a process for converting data into code according to the table (a process in FIG. 9 to be described later, particularly a process of steps S3 to S6). The conversion data processing unit 51, the minimum run successive occurrence limiting processing unit 52, and the conversion pattern determining unit 53 form a data converting unit 60.

The adder 41 inserts a DSV control bit into an input data string at predetermined intervals. The input data string having DSV control bits inserted therein is sent to the conversion data processing unit 51 and the minimum run successive occurrence limiting processing unit 52. The conversion data processing unit 51 has basic patterns and substitution patterns for realizing the maximum run k=7 in Table 3. The conversion data processing unit 51 performs conversion data processing in such a manner as to keep the RLL rule, and then supplies the processed information to the conversion pattern determining unit 53. Information from the immediately preceding code detecting unit 54 is used for the conversion data processing. The conversion data processing unit 51 also has a termination table for inserting a synchronizing pattern. The conversion data processing unit 51 uses the termination table as needed to effect termination at a predetermined position. When the termination table is used, information indicating that the termination table is used is embedded in the synchronizing pattern.

The minimum run successive occurrence limiting processing unit 52 has substitution patterns for limiting successive occurrences of the minimum run d in Table 3. The minimum run successive occurrence limiting processing unit 52 performs processing so as to limit the number of successive occurrences of the minimum run to a predetermined number of times, and then supplies the processed information to the conversion pattern determining unit 53. For the processing, information from the immediately preceding code detecting unit 54 and information from the immediately preceding codeword detecting unit 55 are used. The conversion pattern determining unit 53 selects a finally determined conversion pattern from the information from the conversion data processing unit 51 and the information from the minimum run successive occurrence limiting processing unit 52, and then outputs the codeword string. The synchronizing pattern inserting unit 23 inserts a synchronizing pattern into the codeword string at a predetermined position at a predetermined interval. Termination table processing information output from the conversion data processing unit 51 as needed is used to determine the synchronizing pattern. The output of the synchronizing pattern inserting unit 23 is subjected to NRZI modulation in the NRZI modulation unit 24, and then output as a recording code string (or output as a transmission code string to a transmission line).

The immediately preceding code detecting unit 54 detects the code of one channel bit immediately preceding data to be processed as information necessary to guarantee RLL from the conversion pattern finally determined by the conversion pattern determining unit 53. The immediately preceding code detecting unit 54 supplies a result of the detection to the conversion data processing unit 51 and the minimum run successive occurrence limiting processing unit 52. The immediately preceding codeword detecting unit 55 detects a minimum-unit codeword immediately preceding the data to be processed as information necessary to guarantee the number of successive occurrences of the minimum run from the conversion pattern finally determined by the conversion pattern determining unit 53. The immediately preceding codeword detecting unit 55 supplies a result of the detection to the minimum run successive occurrence limiting processing unit 52.

Timing of operation of each part is managed in synchronism with a timing signal supplied from the timing managing unit not shown in the figure.

FIG. 4 is a block diagram showing a more detailed configuration of main parts of the coding device 11 of FIG. 3. The DSV control bit determining and inserting unit 21 has a shift register 42 for retaining a maximum of 16 bits of output of the adder 41 in units of two bits. The output of the shift register 42 is output to the conversion data processing unit 51 and the minimum run successive occurrence limiting processing unit 52.

The conversion data processing unit 51 includes a conversion pattern detecting unit 71, conversion tables (modulation tables) 72A to 72D, a selector 73, and an indeterminate bit determining unit 74.

The minimum run successive occurrence limiting processing unit 52 includes a minimum run successive occurrence limiting data detection predicting unit 81, a minimum run successive occurrence limiting data detecting unit 82, minimum run successive occurrence limiting tables (modulation tables) 83A and 83B, and an indeterminate bit determining unit 84.

The adder 41 inserts a DSV control bit into an input data string at predetermined intervals. The shift register 42 sequentially shifts the input data string having DSV control bits inserted therein by one-piece data, and arranges the input data string in units of two-piece data, which units are processing units. The data string in units of two-piece data is supplied in parallel to the conversion pattern detecting unit 71, the minimum run successive occurrence limiting data detection predicting unit 81, and the minimum run successive occurrence limiting data detecting unit 82 in numbers of bits necessary for the respective parts to perform the processing thereof.

Since Table 3 is the modulation table, a maximum value of the number of reference bits necessary for each part to perform the processing thereof is 15. However, because processing is performed in units of two-piece data, the shift register 42 retains 16 bits.

The conversion pattern detecting unit 71 detects a conversion pattern keeping the RLL rule from the data string input from the shift register 42. The conversion pattern detecting unit 71 outputs the information (conversion pattern determination information) of a result of the detection to the conversion pattern determining unit 53 and the conversion tables 72A to 72D. The conversion table 72A performs a conversion process for a constraint length i=1. That is, the conversion table 72A converts two-piece data into three channel bits. The conversion table 72A outputs the three channel bits to the selector 73. The conversion table 72B performs a conversion process for a constraint length i=2. That is, the conversion table 72B converts four-piece data into six channel bits. The conversion table 72B outputs the six channel bits to the conversion pattern determining unit 53. The conversion table 72C performs a conversion process for a constraint length i=3. That is, the conversion table 72C converts six-piece data into nine channel bits. The conversion table 72C outputs the nine channel bits to the conversion pattern determining unit 53. The conversion table 72D performs a conversion process for a constraint length i=4. That is, the conversion table 72D converts eight-piece data into 12 channel bits. The conversion table 72D outputs the 12 channel bits to the conversion pattern determining unit 53. In addition, when the conversion pattern detecting unit 71 detects indeterminate data corresponding to an indeterminate code, the conversion pattern detecting unit 71 outputs indeterminate pattern identifying information to the selector 73.

On the basis of the indeterminate pattern identifying information from the conversion pattern detecting unit 71, when the channel bit string supplied from the conversion table 72A includes an indeterminate code (when the indeterminate pattern identifying information indicates the presence of the indeterminate code), the selector 73 outputs the channel bit string supplied from the conversion table 72A to the indeterminate bit determining unit 74.

The indeterminate bit determining unit 74 determines the indeterminate bit included in the three channel bits supplied from the selector 73 on the basis of the output of the immediately preceding code detecting unit 54. The indeterminate bit determining unit 74 then outputs the code string of the three channel bits after the indeterminate bit is determined to the conversion pattern determining unit 53. When the indeterminate code is not included, on the other hand, the selector 73 directly outputs the channel bit string supplied from the conversion table 72A to the conversion pattern determining unit 53.

The conversion data processing unit 51 also has a termination table for inserting a synchronizing pattern. The conversion data processing unit 51 uses the termination table as needed to effect termination at a predetermined position. When the termination table is used, information indicating that the termination table is used is embedded in the synchronizing pattern.

When the minimum run successive occurrence limiting data detecting unit 82 detects a conversion pattern for limiting the number of successive occurrences of the minimum run in the data string supplied from the shift register 42, the minimum run successive occurrence limiting data detecting unit 82 outputs the information as minimum run successive occurrence limiting data detecting information to the conversion pattern determining unit 53, and also outputs the information as minimum run successive occurrence limiting data detecting information to each of the minimum run successive occurrence limiting tables 83A and 83B. The minimum run successive occurrence limiting table 83A converts six-piece data to nine channel bits on the basis of the minimum run successive occurrence limiting data detecting information supplied from the minimum run successive occurrence limiting data detecting unit 82. The minimum run successive occurrence limiting table 83A outputs the code string of the nine channel bits to the conversion pattern determining unit 53. The minimum run successive occurrence limiting table 83B converts 10-piece data to 15 channel bits on the basis of the minimum run successive occurrence limiting data detecting information. The minimum run successive occurrence limiting table 83B outputs the 15 channel bits to the indeterminate bit determining unit 84. The indeterminate bit determining unit 84 determines indeterminate bits included in the 15 channel bits supplied from the minimum run successive occurrence limiting table 83B on the basis of the outputs of the immediately preceding code detecting unit 54 and the immediately preceding codeword detecting unit 55. The indeterminate bit determining unit 84 outputs the code string of the 15 channel bits after the indeterminate bits are determined to the conversion pattern determining unit 53.

When the minimum run successive occurrence limiting data detection predicting unit 81 detects a predetermined conversion pattern of conversion patterns for limiting the number of successive occurrences of the minimum run at a predetermined position (a midpoint position), rather than a start, of the data string input from the shift register 42, the minimum run successive occurrence limiting data detection predicting unit 81 outputs the information as minimum run successive occurrence limiting data detection predicting information to the conversion pattern determining unit 53.

The conversion pattern determining unit 53 determines (selects) one channel bit string (conversion pattern) from the channel bit strings input from the conversion tables 72A to 72D and the minimum run successive occurrence limiting tables 83A and 83B, using the information from the conversion pattern detecting unit 71, the minimum run successive occurrence limiting data detecting unit 82, and the minimum run successive occurrence limiting data detection predicting unit 81. The conversion pattern determining unit 53 outputs the channel bit string to the synchronizing pattern inserting unit 23. The synchronizing pattern inserting unit 23 inserts a synchronizing pattern in the conversion pattern string determined by the conversion pattern determining unit 53 at a predetermined position at a predetermined interval. The synchronizing pattern inserting unit 23 outputs the channel bit string having the synchronizing pattern inserted therein. The synchronizing pattern inserting unit 23 determines the synchronizing pattern using the information on termination table processing which information is generated by the conversion data processing unit 51 and obtained via the conversion pattern determining unit 53. The NRZI modulation unit 24 subjects the channel bit string having the synchronizing pattern inserted therein to NRZI modulation. The NRZI modulation unit 24 then outputs the result as a recording code string (or as a transmission code string when the code string is output to a transmission line).

The immediately preceding code detecting unit 54 detects a channel bit immediately preceding data to be subjected to a next conversion process as information necessary to guarantee RLL from the conversion pattern finally determined by the conversion pattern determining unit 53. The immediately preceding code detecting unit 54 supplies a result of the detection (an immediately preceding code flag) to the indeterminate bit determining unit 74 within the conversion data processing unit 51 and the indeterminate bit determining unit 84 within the minimum run successive occurrence limiting processing unit 52. The immediately preceding codeword detecting unit 55 detects a minimum-unit codeword immediately preceding the data to be subjected to the next conversion process as information necessary to guarantee the number of successive occurrences of the minimum run from the conversion pattern finally determined by the conversion pattern determining unit 53. The immediately preceding codeword detecting unit 55 supplies a result of the detection (an immediately preceding codeword flag) to the indeterminate bit determining unit 84 within the minimum run successive occurrence limiting processing unit 52.

Timing of operation of each part is managed in synchronism with a timing signal supplied from the timing managing unit not shown in the figure.

Correspondences between FIG. 4 and Table 3 are as follows. The minimum run successive occurrence limiting data detecting unit 82 operates when an input data string is (110111) in Table 3 and a following channel bit string is "010", or when an input data string is (1001110111). The minimum run successive occurrence limiting data detection predicting unit 81 operates when a fifth piece and subsequent pieces of data of an input data string are (110111) in Table 3 and a following channel bit string is "010".

Figure 5:
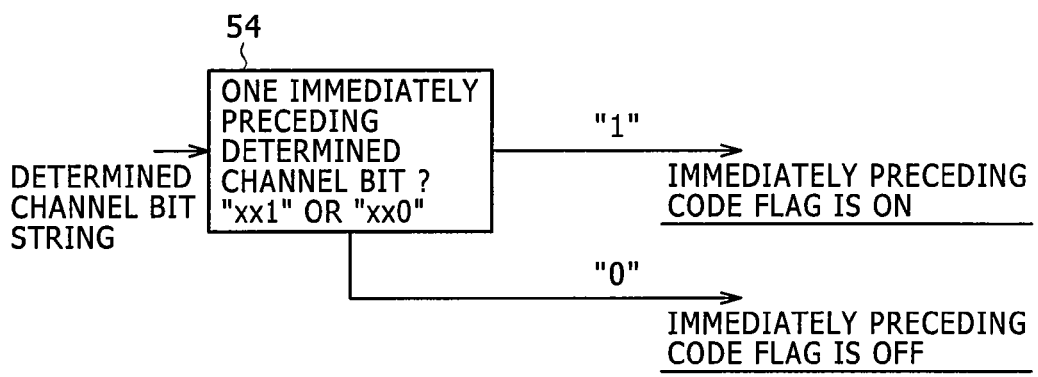
FIG. 5 is a diagram of assistance in explaining a function of an immediately preceding code detecting unit.
Figure 6:
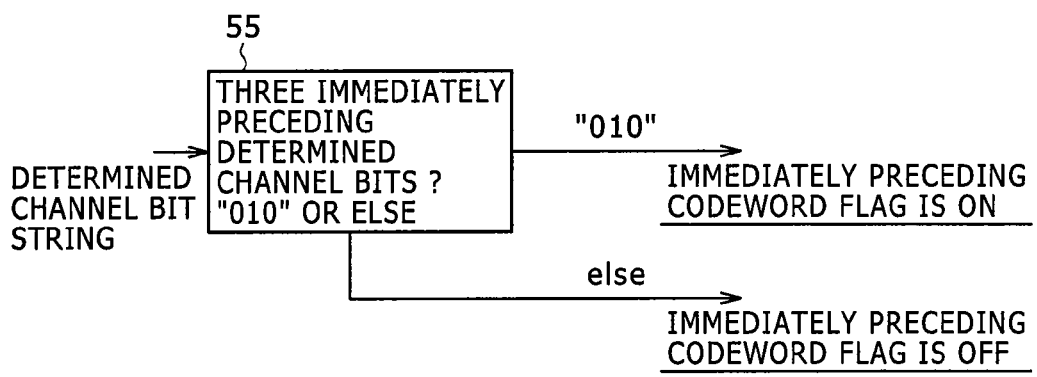
FIG. 6 is a diagram of assistance in explaining a function of an immediately preceding codeword detecting unit.
Figure 7:
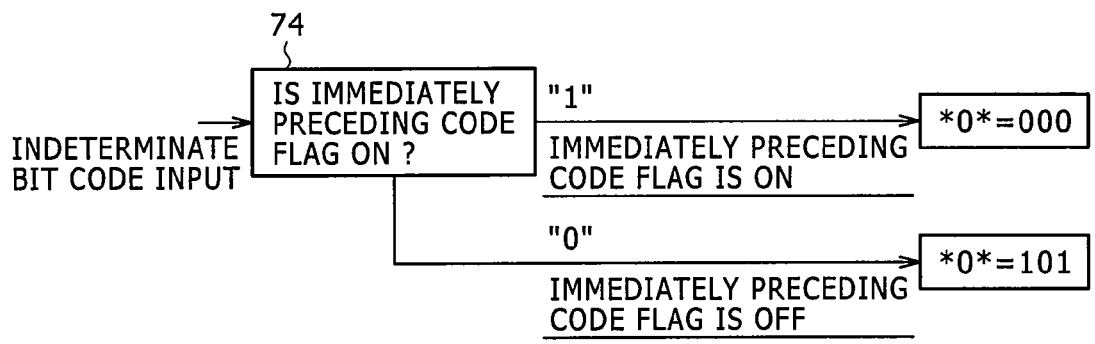
FIG. 7 is a diagram of assistance in explaining a function of an indeterminate bit determining unit within a conversion data processing unit.

As shown in FIG. 5, the immediately preceding code detecting unit 54 stores a last channel bit of a determined conversion pattern (channel bit string), and outputs information (immediately preceding code flag) indicating whether the last channel bit is "1" or "0". As shown in FIG. 6, the immediately preceding codeword detecting unit 55 stores the last but one of the channel bits of the determined conversion pattern (channel bit string), and outputs information (immediately preceding codeword flag) indicating whether the last but one of the channel bits is "1" or "0". Alternatively, the immediately preceding codeword detecting unit 55 stores last three channel bits together with the characteristic of the minimum run d=1, and outputs information (immediately preceding codeword flag) indicating whether the last three channel bits are "010" or not. As shown in FIG. 7, the indeterminate bit determining unit 74 corresponds to a table for converting an input data string (11) to "*0*" in Table 3. When the immediately preceding channel bit is "1" (when the immediately preceding code flag is on), "000" is output, and when the immediately preceding channel bit is "0" (when the immediately preceding code flag is off), "101" is output.

Figure 8:
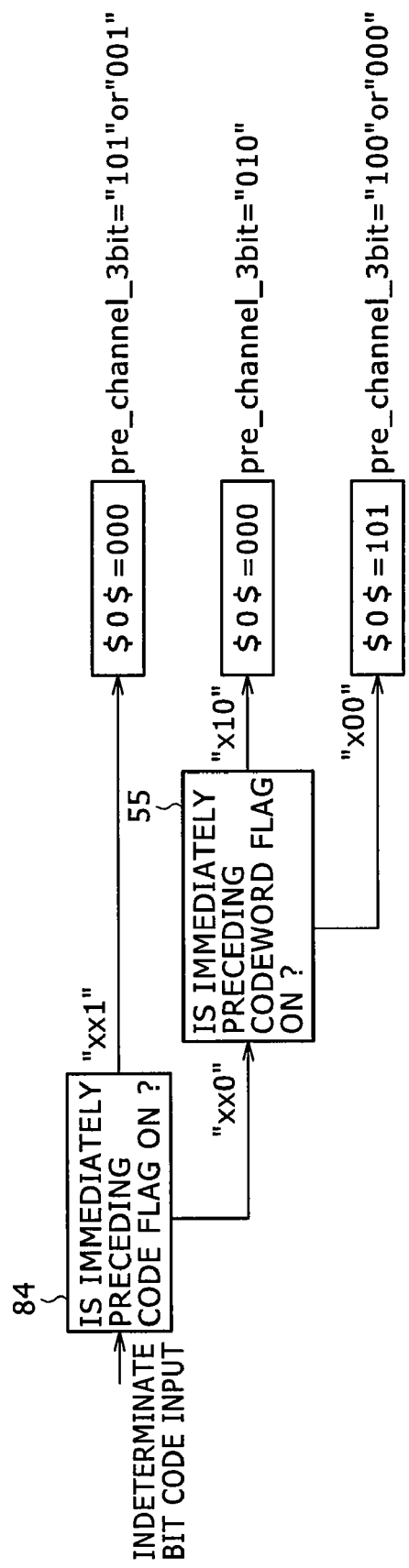
FIG. 8 is a diagram of assistance in explaining a function of an indeterminate bit determining unit within a minimum run successive occurrence limiting processing unit.

As shown in FIG. 8, the indeterminate bit determining unit 84 corresponds to a table for replacing an input data string (1001110111) with a substitution code "$0$ 010 000 000 101" in Table 3. When the immediately preceding code is "1" (when the immediately preceding code flag is on), or when the immediately preceding code is "0" and the immediately preceding codeword is "010" (when the immediately preceding codeword flag is on), the indeterminate codes "$0$" are set to "000". When the immediately preceding codeword is not "010" (when the immediately preceding codeword flag is off), the indeterminate codes "$0$" are set to "101". In other words, when the two immediately preceding channel bits are "10" or "01", a substitution code "000 010 000 000 101" is output, whereas when the two immediately preceding channel bits are "00", a substitution code "101 010 000 000 101" is output.

Further illustrating correspondences between FIG. 4 and Table 3, when outputs from the conversion tables 72A to 72D and outputs from the minimum run successive occurrence limiting tables 83A and 83B coincide with each other, the conversion pattern determining unit 53 determines a conversion pattern using the information from the conversion pattern detecting unit 71, the minimum run successive occurrence limiting data detecting unit 82, and the minimum run successive occurrence limiting data detection predicting unit 81. In a case of (11) and (110111)+"010" in Table 3, for example, the output from the minimum run successive occurrence limiting table 83A with a longer constraint length (latter) is selected. In a case of (10) and (1001110111)+ "other than 010" in Table 3, for example, the output from the minimum run successive occurrence limiting table 83B with a longer constraint length (latter) is selected on the basis of the output from the minimum run successive occurrence limiting data detection predicting unit 81. In a case of (10) and (1001110111)+"010" in Table 3, for example, the output from the conversion table 72A with a shorter constraint length (former) is selected on the basis of the output from the minimum run successive occurrence limiting data detection predicting unit 81.

A recording method (modulating method) of the modulating device 1 in FIG. 1 will next be described with reference to a flowchart of FIG. 9. In step S1, the adder 41 of the DSV control bit determining and inserting unit 21 adds DSV control bits to an input data string. In step S2, the shift register 42 retains the data string having the DSV control bits added thereto, which data string is supplied from the adder 41, in units of two bits. In step S3, the minimum run successive occurrence limiting data detection predicting unit 81 performs a prediction process. In step S4, the minimum run successive occurrence limiting data detecting unit 82, the minimum run successive occurrence limiting tables 83A and 83B, and the indeterminate bit determining unit 84 perform a minimum run successive occurrence limiting data detecting process. In step S5, the conversion data processing unit 51 performs a conversion pattern detecting process.

Incidentally, in practice, these processes of steps S3 to S5 are performed in parallel with each other.

Though details of the prediction process in step S3 will be described later with reference to a flowchart of FIG. 10, the prediction process determines whether data includes a conversion pattern (110111) from a midpoint thereof, and whether next channel bits are "010". When the data includes the conversion pattern (110111) from a midpoint thereof, and the next channel bits are "010", the prediction flag is turned on. Otherwise, the prediction flag is turned off.

On the other hand, though details of the minimum run successive occurrence limiting data detecting process in step S4 will be described later with reference to a flowchart of FIG. 11, the minimum run successive occurrence limiting data detecting process turns on a minimum run successive occurrence limiting data detection flag (10-piece data) when data is a conversion pattern (1001110111), and a process of converting 10-piece data to 15 channel bits is performed. When the data is a conversion pattern (110111) and next channel bits are "010", a minimum run successive occurrence limiting data detection flag (six-piece data) is turned on. Otherwise, the minimum run successive occurrence limiting data detection flag is turned off.

Figure 13:
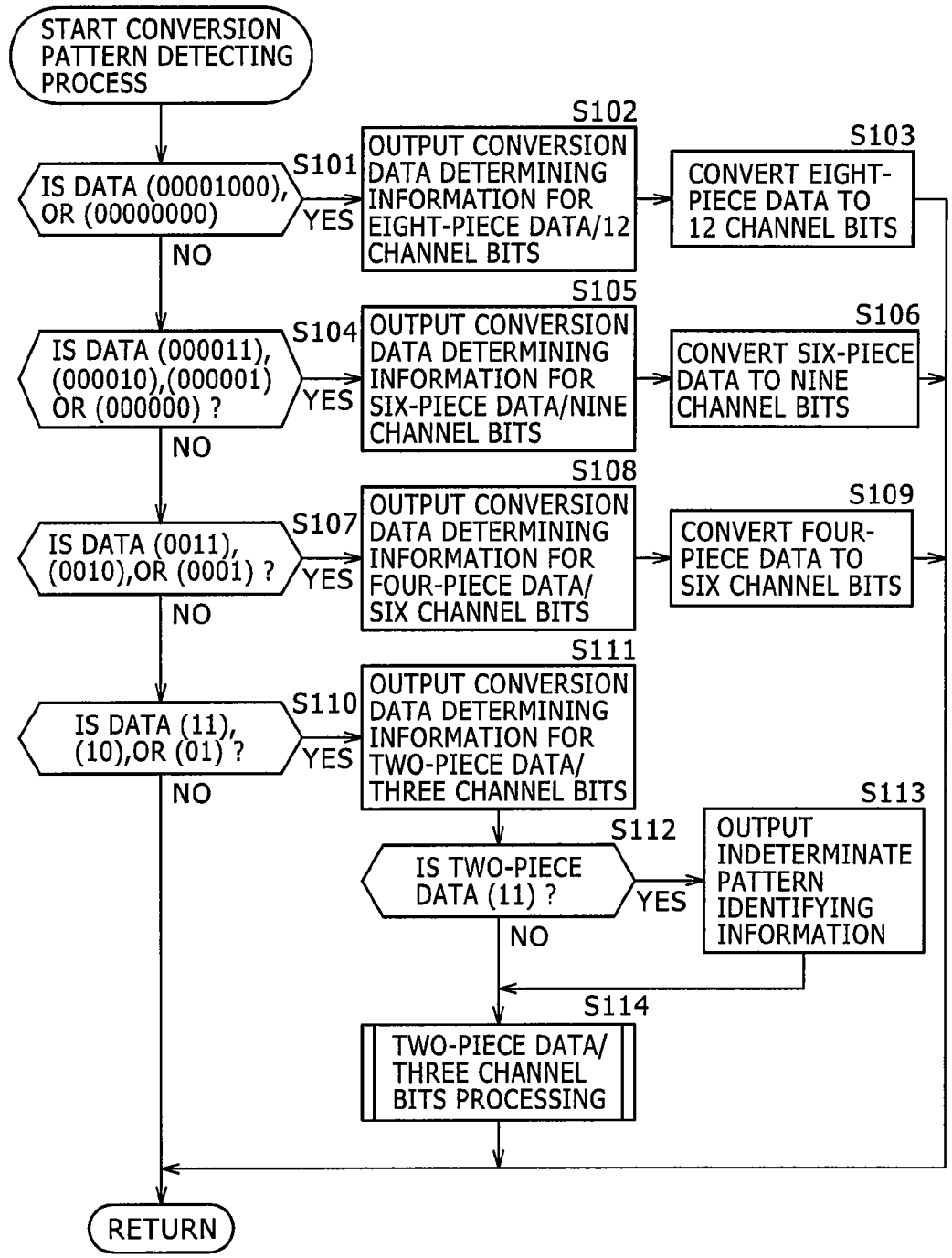
FIG. 13 is a flowchart of assistance in explaining a conversion pattern detecting process in step S5 in FIG. 9.

Though details of the conversion pattern detecting process in step S5 will be described later with reference to a flowchart of FIG. 13, the conversion pattern detecting process performs a process of converting eight-piece data to 12 channel bits, a process of converting six-piece data to nine channel bits, a process of converting four-piece data to six channel bits, or a process of converting two-piece data to three channel bits.

Returning to FIG. 9, in next step S6, the conversion pattern determining unit 53 performs a conversion pattern determining process. Though details of the conversion pattern determining process will be described later with reference to a flowchart of FIG. 17, the conversion pattern determining process selects and outputs one of the conversion patterns converted by the conversion tables 72A to 72D in the conversion data processing unit 51 and the conversion patterns converted by the minimum run successive occurrence limiting tables 83A and 83B.

In step S7, the synchronizing pattern inserting unit 23 inserts a synchronizing pattern in a code string including the finally determined conversion pattern input from the conversion pattern determining unit 53. In step S8, the NRZI modulation unit 24 subjects the code string having the synchronizing pattern inserted therein, the code string being supplied from the synchronizing pattern inserting unit 23, to NRZI modulation. In step S9, the recording unit 12 records a recording code string NRZI-modulated by the NRZI modulation unit 24 onto the recording medium 13.

Details of the prediction process in step S3 in FIG. 9 will next be described with reference to a flowchart of FIG. 10.

In step S31, the minimum run successive occurrence limiting data detection predicting unit 81 determines whether data supplied from the shift register 42 matches a data pattern (xxxx110111). When the input data matches the data pattern (xxxx110111), the minimum run successive occurrence limiting data detection predicting unit 81 determines in step S32 whether next channel bits are "010". When the next channel bits are "010", the minimum run successive occurrence limiting data detection predicting unit 81 in step S33 outputs the prediction flag in an on state as minimum run successive occurrence limiting data detection predicting information to the conversion pattern determining unit 53. Incidentally, the prediction flag is initially set in an off state in advance when the prediction process is started.

When the minimum run successive occurrence limiting data detection predicting unit 81 determines in step S32 that the next channel bits are not "010" (when the next channel bits are "000", "101", or "001"), the minimum run successive occurrence limiting data detection predicting unit 81 in step S34 outputs the prediction flag in an off state. Also when the minimum run successive occurrence limiting data detection predicting unit 81 determines in step S31 that the data does not matches the data pattern (xxxx110111), the minimum run successive occurrence limiting data detection predicting unit 81 in step S34 outputs the prediction flag in the off state.

The prediction flag is used in step S232 in FIG. 17.

The minimum run successive occurrence limiting data detecting process in step S4 in FIG. 9 will next be described with reference to a flowchart of FIG. 11.

In step S51, the minimum run successive occurrence limiting data detecting unit 82 in the minimum run successive occurrence limiting data processing unit 52 turns off a minimum run successive occurrence limiting data detection flag. That is, the minimum run successive occurrence limiting data detection flag (10-piece data) and the minimum run successive occurrence limiting data detection flag (six-piece data) are initially set in an off state. In step S52, the minimum run successive occurrence limiting data detecting unit 82 determines whether data supplied from the shift register 42 matches a data pattern (1001110111). When the input data matches the data pattern (1001110111), the minimum run successive occurrence limiting data detecting unit 82 in step S53 outputs the minimum run successive occurrence limiting data detection flag (10-piece data) in an on state as minimum run successive occurrence limiting data detecting information to the conversion pattern determining unit 53 and the minimum run successive occurrence limiting tables 83A and 83B.

In step S54, the minimum run successive occurrence limiting table 83B performs 10-piece data/15 channel bits processing. Details of the processing are shown in FIG. 12.

Specifically, in step S81, the minimum run successive occurrence limiting table 83B outputs "$0$ 010 000 000 101" to the indeterminate bit determining unit 84. In step S82, the indeterminate bit determining unit 84 determines whether the immediately preceding code flag is on. The immediately preceding code flag is output to the indeterminate bit determining unit 84 by the immediately preceding code detecting unit 54. Though details of the immediately preceding code flag will be described later with reference to a flowchart of FIG. 15, the immediately preceding code flag is on when one channel bit of an immediately preceding codeword string is "1".

When the indeterminate bit determining unit 84 determines in step S82 that the immediately preceding code flag is on (when the immediately preceding code is "1"), the indeterminate bit determining unit 84 in step S86 sets a codeword "$0$" including an indeterminate code supplied from the minimum run successive occurrence limiting table 83B to "000". The indeterminate bit determining unit 84 in step S87 outputs "000 010 000 000 101" to the conversion pattern determining unit 53.

When the indeterminate bit determining unit 84 determines in step S82 that the immediately preceding code flag is not on (the immediately preceding code flag is off) (when the immediately preceding code is "0"), the indeterminate bit determining unit 84 in step S83 determines whether the immediately preceding codeword flag is on. The immediately preceding codeword flag is detected by the immediately preceding codeword detecting unit 55, and supplied to the indeterminate bit determining unit 84. This flag is detected as shown in a flowchart of FIG. 16. Though details of the flag will be described later with reference to the flowchart of FIG. 16, the immediately preceding codeword flag is on when three channel bits of the immediately preceding codeword string is "010".

When the indeterminate bit determining unit 84 determines in step S83 that the immediately preceding codeword flag is on (when the immediately preceding codes are "010"), the indeterminate bit determining unit 84 in step S86 sets "$0$" to "000" as in the case where the immediately preceding code flag is on. The indeterminate bit determining unit 84 in step S87 outputs the channel bit string "000 010 000 000 101" to the conversion pattern determining unit 53.

When the indeterminate bit determining unit 84 determines in step S83 that the immediately preceding codeword flag is not on (the immediately preceding codeword flag is off) (when the immediately preceding codes are not "010"), the indeterminate bit determining unit 84 in step S84 sets the codeword "$0$" to "101". The indeterminate bit determining unit 84 in step S85 outputs a channel bit string "101 010 000 000 101" to the conversion pattern determining unit 53.

Returning to FIG. 11, when the minimum run successive occurrence limiting data detecting unit 82 determines in step S52 that the data does not match the data pattern (1001110111), the minimum run successive occurrence limiting data detecting unit 82 in step S55 determines whether the data matches a data pattern (110111). When the data matches the data pattern (110111), the minimum run successive occurrence limiting data detecting unit 82 in step S56 determines whether next three channel bits are "010". When the next three channel bits are "010", the minimum run successive occurrence limiting data detecting unit 82 in step S58 outputs the minimum run successive occurrence limiting data detection flag (six-piece data) in an on state as minimum run successive occurrence limiting data detecting information to the conversion pattern determining unit 53 and the minimum run successive occurrence limiting tables 83A and 83B. In step S59, the minimum run successive occurrence limiting table 83A outputs a substitution code "001 000 000" to the conversion pattern determining unit 53.

When the minimum run successive occurrence limiting data detecting unit 82 determines in step S56 that the next three channel bits are not "010", the minimum run successive occurrence limiting data detecting unit 82 in step S57 outputs the minimum run successive occurrence limiting data detection flag in an off state to the conversion pattern determining unit 53. Also when the minimum run successive occurrence limiting data detecting unit 82 determines in step S55 that the data does not match the data pattern (110111), the minimum run successive occurrence limiting data detection flag in the off state is output in step S57. The minimum run successive occurrence limiting data detection flag being in the off state means that the minimum run successive occurrence limiting data detection flag (10-piece data) is off, and that the minimum run successive occurrence limiting data detection flag (six-piece data) is off.

Details of the conversion pattern detecting process in step S5 in FIG. 9 will next be described with reference to a flowchart of FIG. 13.

In step S101, the conversion pattern detecting unit 71 determines whether data input from the shift register 42 matches a data pattern (00001000) or (00000000). When the input data matches the data pattern (00001000) or (00000000), the conversion pattern detecting unit 71 in step S102 outputs conversion data determining information for eight-piece data/12 channel bits. This information is supplied to the conversion pattern determining unit 53 and the conversion tables 72A to 72D. In step S103, the conversion table 72D converts eight-piece data to 12 channel bits. Then, the 12 channel bits are supplied to the conversion pattern determining unit 53. Specifically, when the input data matches the data pattern (00001000) or (00000000), a code string "000 100 100 100" or "010 100 100 100", respectively, is output. The information output in step S102 is used in step S236 in FIG. 17. The code string converted in step S103 is selected and output in step S237.

When the conversion pattern detecting unit 71 determines in step S101 that the input data does not match the data pattern (00001000) or (00000000), the conversion pattern detecting unit 71 in step S104 determines whether the input data matches a data pattern (000011), (000010), (000001), or (000000). When the input data matches one of the four data patterns, the conversion pattern detecting unit 71 in step S105 outputs determining information for six-piece data/nine channel bits to the conversion pattern determining unit 53 and the conversion tables 72A to 72D. In step S106, the conversion table 72C converts six-piece data to nine channel bits. The conversion table 72C then outputs the nine channel bits to the conversion pattern determining unit 53. Specifically, when the input data is one of the four data patterns (000011), (000010), (000001), or (000000), a code string "000 100 100", "000 100 000", "010 100 100", or "010 100 000", respectively, is output. The information output in step S105 is used in step S238 in FIG. 17. The code string converted in step S106 is selected and output in step S239.

When the conversion pattern detecting unit 71 determines in step S104 that the input data does not match any of the data pattern (000011), (000010), (000001), and (000000), the conversion pattern detecting unit 71 in step S107 determines whether the input data matches a data pattern (0011), (0010), or (0001). When the input data matches one of the three data patterns, the conversion pattern detecting unit 71 in step S108 outputs conversion data determining information for four-piece data/six channel bits to the conversion pattern determining unit 53 and the conversion tables 72A to 72D. In step S109, the conversion table 72B converts four-piece data to six channel bits. The conversion table 72B then outputs the six channel bits to the conversion pattern determining unit 53. Specifically, when the input data matches the data pattern (0011), a code string "010 100" is output. When the input data matches the data pattern (0010), a code string "010 000" is output. When the input data matches the data pattern (0001), a code string "000 100" is output. The information output in step S108 is used in step S240 in FIG. 17. The code string converted in step S109 is selected and output in step S241.

When the conversion pattern detecting unit 71 determines in step S107 that the input data does not match any of the data patterns (0011), (0010), and (0001), the conversion pattern detecting unit 71 in step S110 determines whether the input data matches a data pattern (11), (10), or (01). When the input data matches one of the three data patterns, the conversion pattern detecting unit 71 in step S111 outputs conversion data determining information for two-piece data/three channel bits to the conversion pattern determining unit 53 and the conversion tables 72A to 72D. This information is used in step S243 in FIG. 17.

In step S112, the conversion pattern detecting unit 71 determines whether the input two-piece data matches the data pattern (11). When the input data matches the data pattern (11), the conversion pattern detecting unit 71 in step S113 outputs indeterminate pattern identifying information to the selector 73. The indeterminate pattern identifying information is used in step S142 in FIG. 14 to be described later.

When the conversion pattern detecting unit 71 determines in step S112 that the input data does not match the data pattern (11), the process of step S113 is skipped. After the process of step S13, or when the conversion pattern detecting unit 71 determines in step S112 that the input data does not match the data pattern (11), the conversion table 72A in step S114 performs two-piece data/three channel bits processing. Details of the two-piece data/three channel bits processing are shown in a flowchart of FIG. 14.

Figure 14:
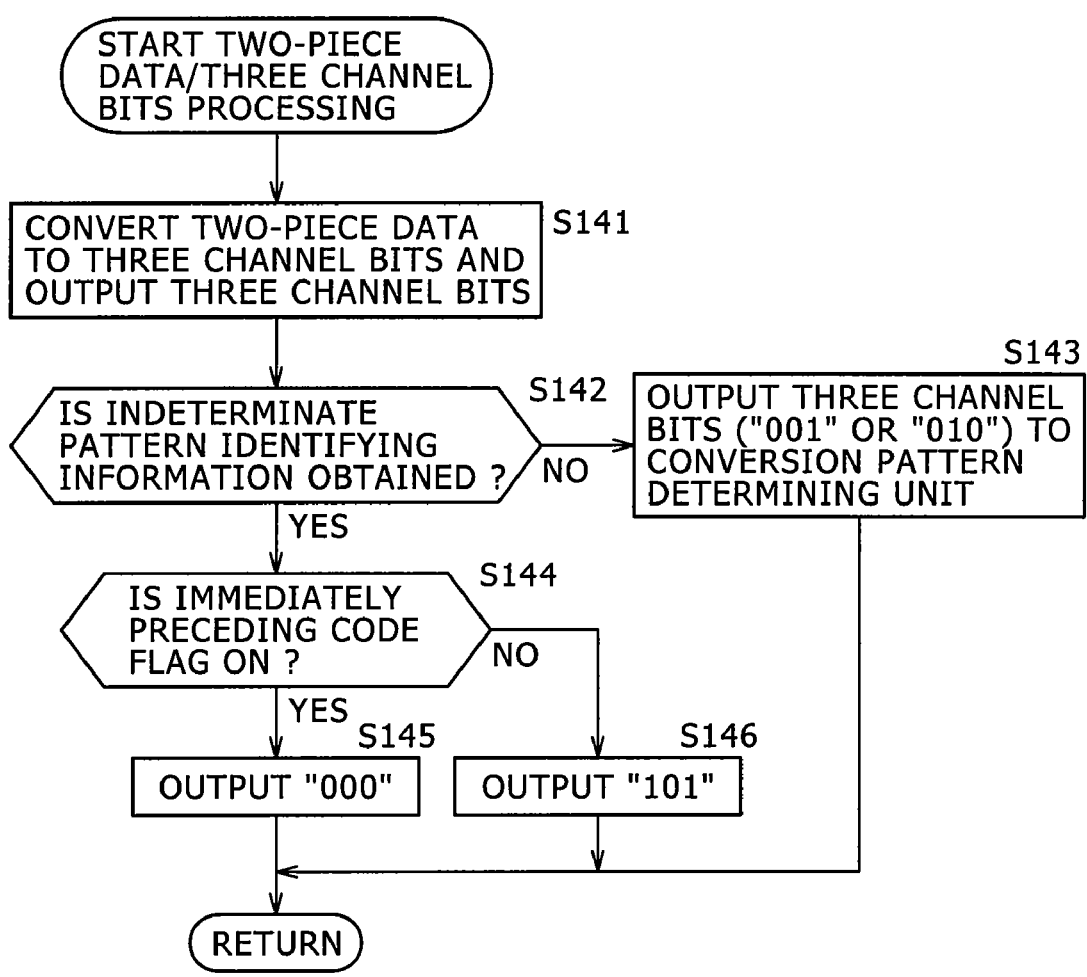
FIG. 14 is a flowchart of assistance in explaining two-piece data/three channel bits processing in step S114 in FIG. 13.

Details of the two-piece data/three channel bits processing in step S114 in FIG. 13 will next be described with reference to the flowchart of FIG. 14.

In step S141, the conversion table 72A converts two-piece data to three channel bits, and then outputs the three channel bits to the selector 73. Specifically, the conversion table 72A outputs a code string "*0*" when the input data matches the data pattern (11). The conversion table 72A outputs a codeword "001" when the input data matches the data pattern (10). The conversion table 72A outputs a codeword "010" when the input data matches the data pattern (01).

In step S142, the indeterminate bit determining unit 74 determines whether the indeterminate pattern identifying information is obtained. When the indeterminate pattern identifying information (output in step S113 in FIG. 13) is not obtained from the conversion pattern detecting unit 71, the selector 73 in step S143 outputs three channel bits to the conversion pattern determining unit 53. Specifically, the channel bits "001" or "010" input from the conversion table 72A are output to the conversion pattern determining unit 53. The code string output in step S143 is selected and output in step S245 in FIG. 17.

On the other hand, when the indeterminate bit determining unit 74 determines in step S142 that the indeterminate pattern identifying information is obtained from the conversion pattern detecting unit 71, the indeterminate bit determining unit 74 in step S144 determines whether the immediately preceding code flag is on. This immediately preceding code flag is supplied from the immediately preceding code detecting unit 54 on the basis of the process of FIG. 15 to be described later. When the immediately preceding code flag is on (when one channel bit of an immediately preceding codeword string is "1"), the indeterminate bit determining unit 74 in step S145 outputs a codeword "000" to the conversion pattern determining unit 53. On the other hand, when the immediately preceding code flag is not on (when the immediately preceding code flag is off) (when one channel bit of the immediately preceding codeword string is "0"), the indeterminate bit determining unit 74 in step S146 outputs a codeword "101" to the conversion pattern determining unit 53. The code strings output in steps S145 and S146 are selected and output in step S244 in FIG. 17.

Figure 15:
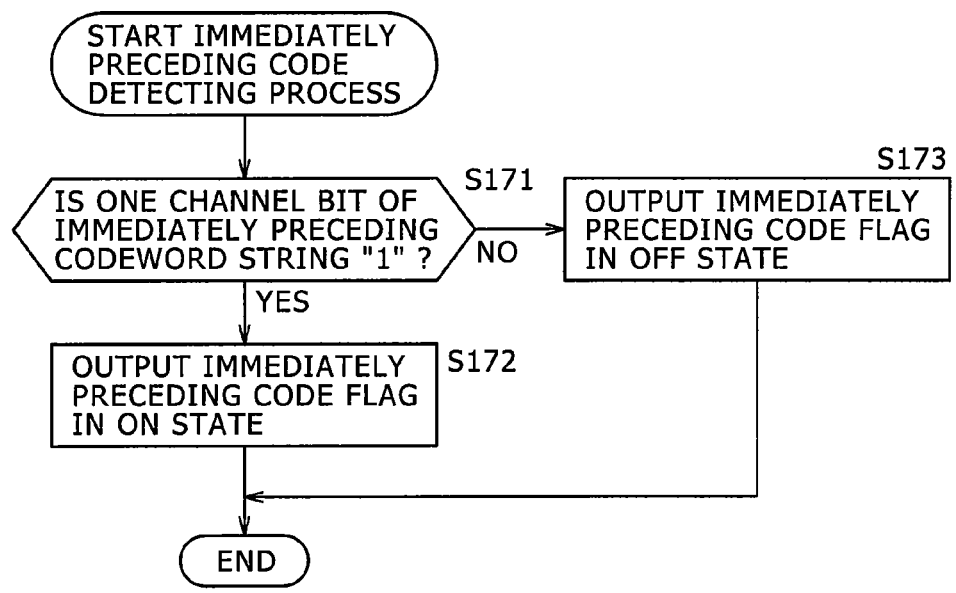
FIG. 15 is a flowchart of assistance in explaining an immediately preceding code detecting process.
Figure 16:
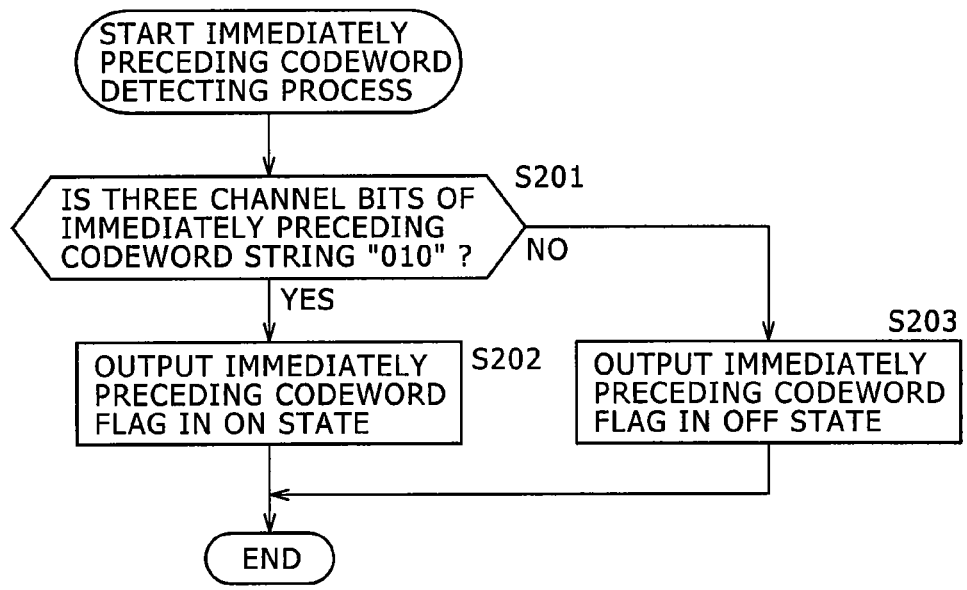
FIG. 16 is a flowchart of assistance in explaining an immediately preceding codeword detecting process.

The processes of the immediately preceding code detecting unit 54 and the immediately preceding codeword detecting unit 55 will next be described with reference to flowcharts of FIG. 15 and FIG. 16.

The immediately preceding code detecting process of the immediately preceding code detecting unit 54 will first be described with reference to the flowchart of FIG. 15.

In step S171, the immediately preceding code detecting unit 54 determines from the conversion pattern finally determined by the conversion pattern determining unit 53 whether one channel bit of the code string immediately preceding data to be subjected to a next conversion process is "1". When one channel bit of the immediately preceding code string is "1", the immediately preceding code detecting unit 54 in step S172 outputs the immediately preceding code flag in an on state. On the other hand, when the immediately preceding code detecting unit 54 determines in step S171 that one channel bit of the immediately preceding code string is not "1" (when the immediately preceding code detecting unit 54 determines that one channel bit of the immediately preceding code string is "0"), the immediately preceding code detecting unit 54 in step S173 outputs the immediately preceding code flag in an off state. The immediately preceding code flag is output to the indeterminate bit determining unit 74 and the indeterminate bit determining unit 84, and used in step S82 in FIG. 12 and step S144 in FIG. 14.

The immediately preceding codeword detecting process of the immediately preceding codeword detecting unit 55 will next be described with reference to the flowchart of FIG. 16.

In step S201, the immediately preceding codeword detecting unit 55 determines from the conversion pattern finally determined by the conversion pattern determining unit 53 whether three channel bits of the codeword string immediately preceding data to be subjected to a next conversion process are "010". When the three channel bits of the immediately preceding codeword string are "010", the immediately preceding codeword detecting unit 55 in step S202 outputs the immediately preceding codeword flag in an on state. When the immediately preceding codeword detecting unit 55 determines in step S201 that the three channel bits of the immediately preceding codeword string are not "010" (when the three channel bits are "000", "101", or "001"), the immediately preceding codeword detecting unit 55 in step S203 outputs the immediately preceding codeword flag in an off state. The immediately preceding codeword flag is output to the indeterminate bit determining unit 84, and used in step S83 in FIG. 12.

Details of the conversion pattern determining process in step S6 in FIG. 9 will next be described with reference to a flowchart of FIG. 17.

In step S231, the conversion pattern determining unit 53 determines whether the minimum run successive occurrence limiting data detection flag (10-piece data) is on. The minimum run successive occurrence limiting data detection flag (10-piece data) is output by the minimum run successive occurrence limiting data detecting unit 82 in step S53 or S57 in FIG. 11. When the minimum run successive occurrence limiting data detection flag (10-piece data) is on (when input data matches a data pattern (1001110111)), the conversion pattern determining unit 53 in step S232 determines whether the prediction flag is on. This prediction flag is output by the minimum run successive occurrence limiting data detection predicting unit 81 in step S33 or S34 in FIG. 10.

When the prediction flag is not on (when the prediction flag is off) (when the input data string does not match a data pattern (xxxx110111), or when the input data string matches the data pattern (xxxx110111) but next channel bits are not "010"), the conversion pattern determining unit 53 in step S233 selects and outputs 10-piece data/15 channel bits. That is, when the prediction flag is off (when the data is not (xxxx110111), or when the data is (xxxx110111) but the next channel bits are not "010"), the code string output in step S85 or S87 in FIG. 12 is selected and then output to the synchronizing pattern inserting unit 23.

On the other hand, when the prediction flag is on (when the data is (xxxx110111) and the next channel bits are "010"), the process of step S233 is not performed, but a process of two-piece data/three channel bits conversion in step S242 and subsequent steps to be described later is performed. Thus, when minimum run successive occurrence limiting data (1001110111) including minimum run successive occurrence limiting data (110111)+"010" as part of the minimum run successive occurrence limiting data (1001110111) is the input data, and therefore (xxxx110111)+"010" is satisfied, the input data (1001110111) is divided and subjected to a process of converting two bits from the beginning rather than being subjected to an en bloc conversion process.

Specifically, when the prediction flag is on, the conversion pattern determining unit 53 in step S242 determines whether conversion data determining information for two-piece data/three channel bits is received from the conversion pattern detecting unit 71. This information is output in step S111 in FIG. 13. When the conversion data determining information for two-piece data/three channel bits is received, the conversion pattern determining unit 53 in step S243 further determines whether the conversion data determining information for two-piece data/three channel bits is conversion data determining information for data (11). That is, whether the data is the data pattern to be converted to codes including an indeterminate code is determined. When the conversion pattern determining unit 53 determines in step S242 that the conversion data determining information for the data (11) is received, the conversion pattern determining unit 53 in step S244 selects and outputs the three channel bits output by the indeterminate bit determining unit 74. That is, the code string output in the process of step S145 or S146 in FIG. 14 is selected and output.

On the other hand, when the conversion pattern determining unit 53 determines in step S243 that the conversion data determining information for two-piece data/three channel bits is not the conversion data determining information for the data (11) (when the channel bits are not the channel bits of the data to be converted to codes including an indeterminate code), the conversion pattern determining unit 53 in step S245 selects and outputs the three channel bits of the selector 73. That is, in this case, the code string output in step S143 in FIG. 14 is selected and output.

When the conversion pattern determining unit 53 determines in step S231 that the minimum run successive occurrence limiting data detection flag (10-piece data) is not on (the minimum run successive occurrence limiting data detection flag (10-piece data) is off) (when the conversion pattern determining unit 53 determines that the data pattern of the input data is not (1001110111)), the conversion pattern determining unit 53 in step S234 determines whether the minimum run successive occurrence limiting data detection flag (six-piece data) is on. The minimum run successive occurrence limiting data detection flag (six-piece data) is output in step S58 in FIG. 11 when the data pattern is (110111) and next three channel bits are "010". When the conversion pattern determining unit 53 determines in step S234 that the minimum run successive occurrence limiting data detection flag (six-piece data) is on, the conversion pattern determining unit 53 in step S235 selects and outputs an substitution code "001 000 000". The substitution code is output in step S59 in FIG. 11.

Figure 9:
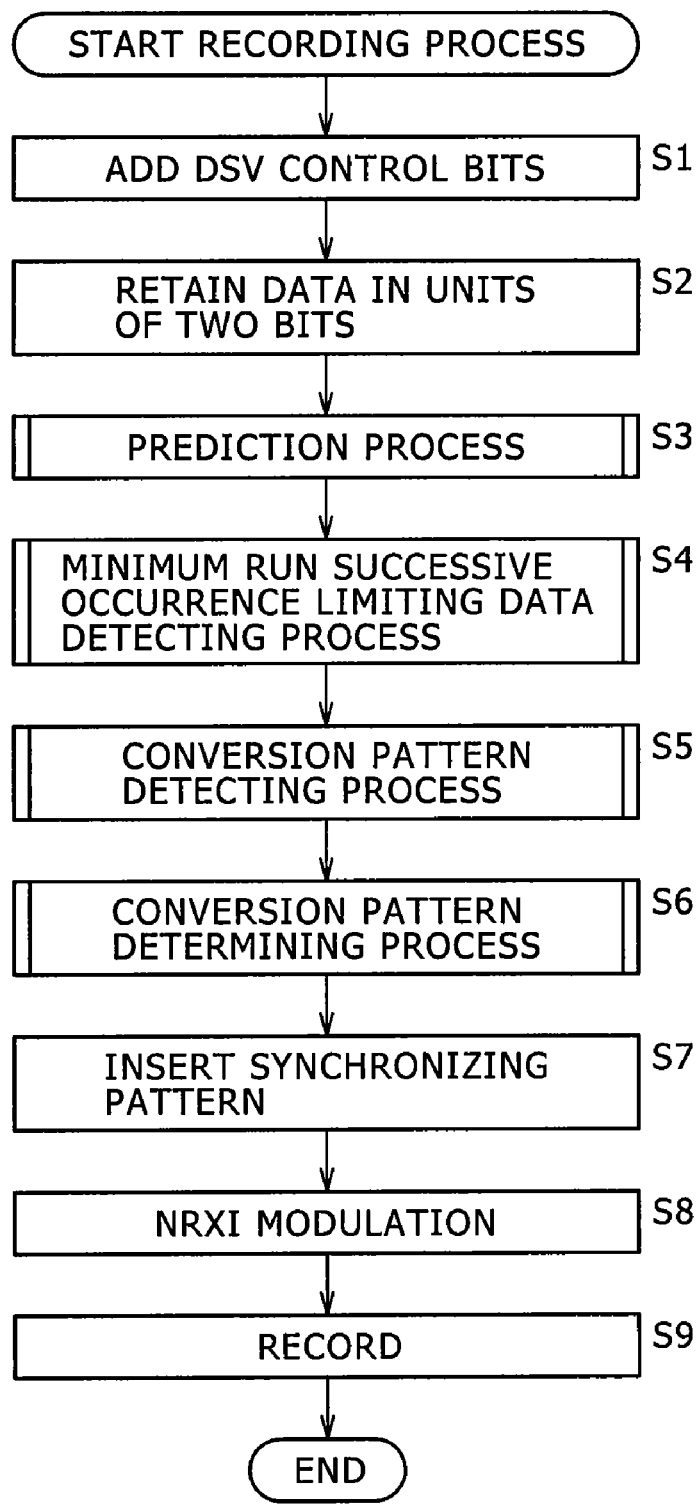
FIG. 9 is a flowchart of assistance in explaining a recording process.

After the process of step S233 or S235, the process returns to step S7 in FIG. 9. Thus, even when data (10) and (01) is subjected to a conversion process in parallel, the process of step S233 or S235 is preferentially performed.

When the conversion pattern determining unit 53 determines in step S234 that the minimum run successive occurrence limiting data detection flag (six-piece data) is off (when the input data pattern is not (110111), or when the input data pattern is (110111) but the next channel bits are not "010"), the conversion pattern determining unit 53 in step S236 determines whether conversion data determining information for eight-piece data/12 channel bits is received. This determining information is output in step S102 in FIG. 13. When the conversion data determining information for eight-piece data/12 channel bits is received, the conversion pattern determining unit 53 in step S237 selects and outputs an eight-piece data/12 channel bits conversion output. That is, the channel bits converted in step S103 in FIG. 13 are selected and output.

When the conversion pattern determining unit 53 determines in step S236 that conversion data determining information for eight-piece data/12 channel bits is not received, the conversion pattern determining unit 53 in step S238 determines whether conversion data determining information for six-piece data/nine channel bits is received. This determining information is output in step S105 in FIG. 13. When the conversion data determining information for six-piece data/nine channel bits is received, the conversion pattern determining unit 53 in step S239 selects and outputs a six-piece data/nine channel bits conversion output. That is, the data output in step S106 in FIG. 13 is selected and output.

When the conversion pattern determining unit 53 determines in step S238 that conversion data determining information for six-piece data/nine channel bits is not received, the conversion pattern determining unit 53 in step S240 determines whether conversion data determining information for four-piece data/six channel bits is received. This determining information is output in step S108 in FIG. 13. When the conversion data determining information for four-piece data/six channel bits is received, the conversion pattern determining unit 53 in step S241 selects and outputs a four-piece data/six channel bits conversion output. That is, the channel bits output in step S109 in FIG. 13 are selected and output.

When the conversion pattern determining unit 53 determines in step S240 that conversion data determining information for four-piece data/six channel bits is not received, the process of steps S242 to S245 is performed in the same manner as in the above-described case. After the processes of steps S237, S239, S241, S244, and S245, the process returns to step S7 in FIG. 9.

When a conversion pattern is determined as described above, the data string in the shift register 42 is shifted by an amount corresponding to the determined channel bits, and a process of determining a conversion pattern for next data is performed.

Figure 18:
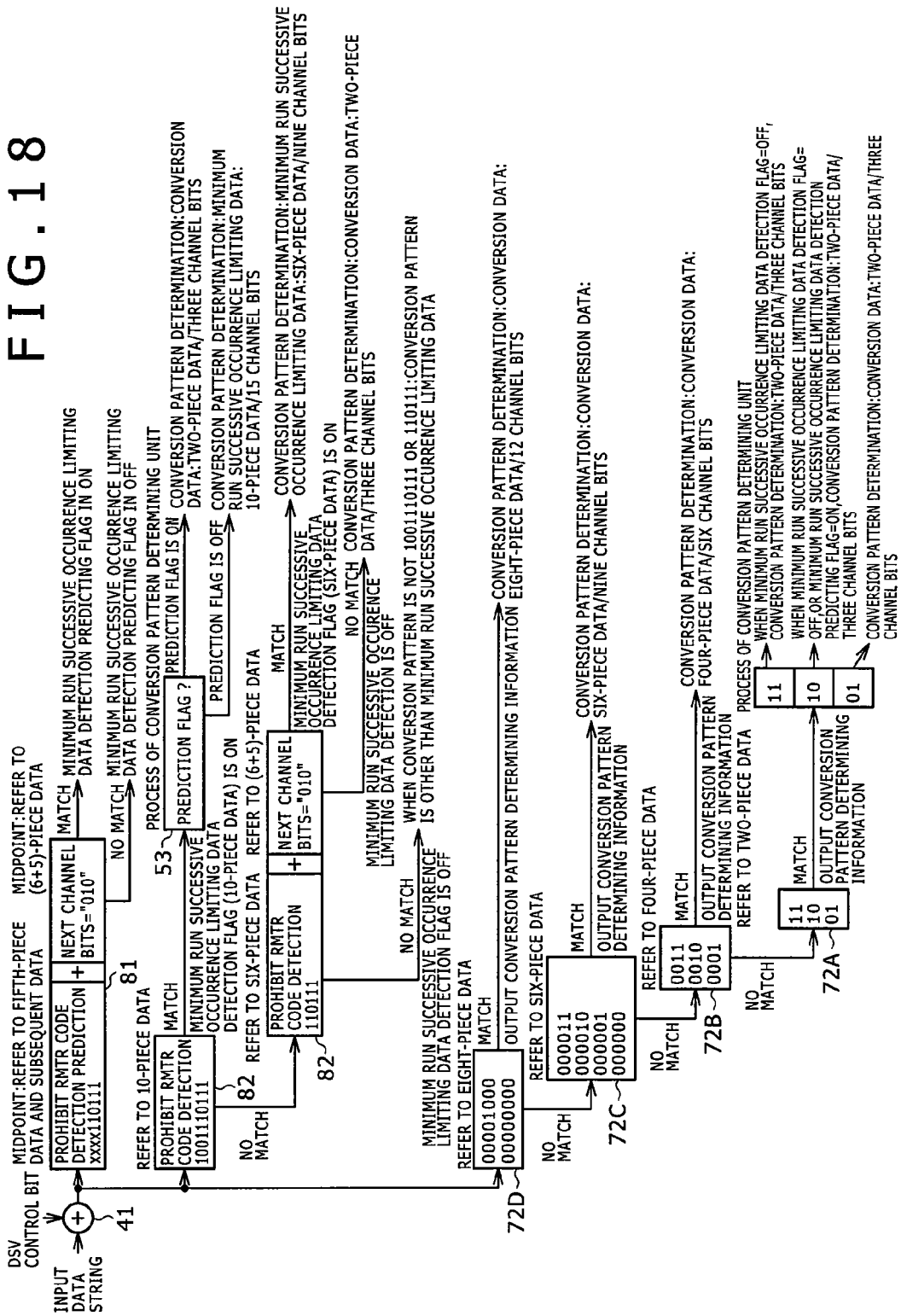
FIG. 18 is a diagram of assistance in explaining main processing of a modulating unit.

Of the above processes, the processes of the minimum run successive occurrence limiting data detection predicting unit 81, the minimum run successive occurrence limiting data detecting unit 82, the minimum run successive occurrence limiting tables 83A and 83B, the conversion pattern detecting unit 71, and the conversion tables 72A to 72D will be further described with reference to FIG. 18.

When an input data string is (xxxx110111), whether next three channel bits are "010" is determined. When the next three channel bits are "010", the minimum run successive occurrence limiting data detection predicting unit 81 outputs the prediction flag in an on state. When the next three channel bits do not match "010", the minimum run successive occurrence limiting data detection predicting unit 81 outputs the prediction flag in an off state.

The minimum run successive occurrence limiting data detecting unit 82 detects minimum run successive occurrence limiting data by determining whether 10-piece data of the input data string matches the minimum run successive occurrence limiting data (1001110111) as 10-piece data with a constraint length i=5 in Table 3. When the 10-piece data of the input data string matches the minimum run successive occurrence limiting data (1001110111), the conversion pattern determining unit 53 further determines whether a following channel bit string is "010" on the basis of the prediction flag. When the following channel bit string is not "010" (when the prediction flag is off), the data (1001110111) is converted en bloc. When the following channel bit string is "010" (when the prediction flag is on), the data (1001110111) is not converted en bloc, but is divided and subjected to a process of converting two bits from the beginning (subjected to exceptional processing). When the 10-piece data does not match the data pattern (1001110111), the minimum run successive occurrence limiting data detecting unit 82 determines whether six-piece data matches the minimum run successive occurrence limiting data (110111) as six-piece data with a constraint length i=3 in Table 3. When the six-piece data matches the minimum run successive occurrence limiting data (110111), the minimum run successive occurrence limiting data detecting unit 82 further refers to five succeeding pieces of data to see in the data string whether a following channel bit string is "010". When the five-piece data matches, from the beginning, one of the patterns (01), (001), (00000), and termination (0000), a process of detecting minimum run successive occurrence limiting codes for the six-piece data is performed.

In detecting a conversion pattern, the conversion pattern detecting unit 71 refers to eight pieces of data of the input data string, and determines whether the eight-piece data matches a conversion pattern of eight-piece data with a constraint length of four in Table 3. When there is a matching pattern, the conversion table 72D determines a substitution code. When the eight-piece data pattern does not match, the conversion pattern detecting unit 71 refers to up to six pieces of data, and determines whether the six-piece data matches a conversion pattern of six-piece data with a constraint length of three in Table 3. When there is a matching pattern, the conversion table 72C determines a conversion code. When the six-piece data pattern does not match, the conversion pattern detecting unit 71 refers to up to four pieces of data, and determines whether the four-piece data matches a conversion pattern of four-piece data with a constraint length of two in Table 3. When there is a matching pattern, the conversion table 72B determines a conversion code. When the four-piece data pattern does not match, the conversion pattern detecting unit 71 finally refers to up to two pieces of data, and determines whether the two-piece data matches one of the patterns (11), (10), and (01) of two-piece data with a constraint length of one in Table 3. When there is a matching pattern among the patterns (11), (10), and (01), the conversion table 72A determines a conversion code.

Then, each piece of data in the input data string in the shift register 42 is advanced by an amount corresponding to the determined code, and a next detection process is repeated in a similar manner.

Figure 19:
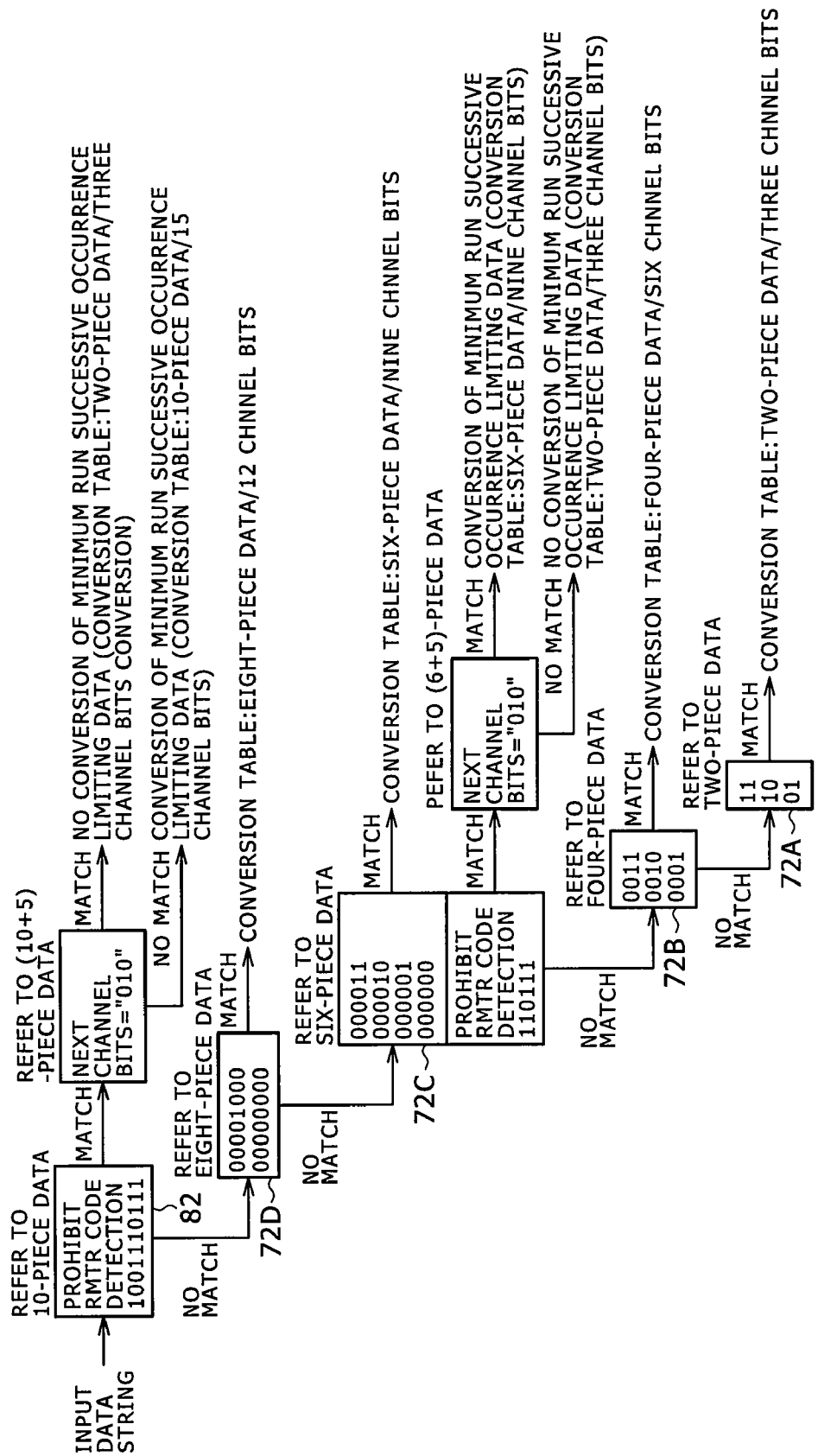
FIG. 19 is another diagram of assistance in explaining the main processing of the modulating unit.

Data detections sorted by constraint length will be described with reference to FIG. 19. The minimum run successive occurrence limiting data detecting unit 82 refers to 10-piece data from an input data string, and determines whether the 10-piece data matches the minimum run successive occurrence limiting data (1001110111) as 10-piece data with a constraint length of five in Table 3. When the 10-piece data matches the minimum run successive occurrence limiting data (1001110111), a process of converting the minimum run successive occurrence limiting data as the 10-piece data is performed, except for the following exceptional processing. For the exceptional processing, in order to further see in the data string whether a condition that a following channel bit string be "010" (a condition for the exceptional processing) is satisfied, the minimum run successive occurrence limiting data detection predicting unit 81 refers to five succeeding pieces of data. When the five-piece data matches, from the beginning, one of the patterns (01), (001), (00000), and termination (0000), the minimum run successive occurrence limiting data (1001110111) is not subjected to an en bloc conversion process, but is divided and subjected to a process of processing two bits from the beginning (exceptional processing).

When the 10-piece data does not match, the minimum run successive occurrence limiting data detecting unit 82 refers to up to eight pieces of data, and determines whether the eight-piece data matches a conversion pattern of eight-piece data with a constraint length of four in Table 3. When there is a matching pattern, the conversion table 72D determines a substitution code.

When the eight-piece data does not match a conversion pattern, the minimum run successive occurrence limiting data detecting unit 82 refers to up to six pieces of data, and determines whether the six-piece data matches the minimum run successive occurrence limiting data (110111) of six-piece data with a constraint length of three in Table 3. When the data matches the pattern (110111), the minimum run successive occurrence limiting data detecting unit 82 further refers to five succeeding pieces of data to see in the data string whether a condition that a following channel bit string be "010" is satisfied. When the five-piece data matches, from the beginning, one of the patterns (01), (001), (00000), and termination (0000), a process of converting the minimum run successive occurrence limiting data as six-piece data is performed. When the five-piece data does not match any of these patterns, the process of converting the minimum run successive occurrence limiting data as six-piece data is not performed, and the minimum run successive occurrence limiting data is divided into units of two bits and then subjected to conversion processing.

When the data pattern (110111) is not detected, whether the data matches a conversion pattern of six-piece data with a constraint length of three in Table 3 is further determined. When there is a matching pattern, the conversion table 72C determines a conversion code. When the six-piece data does not match a conversion pattern, up to four pieces of data are referred to, and whether the four-piece data matches a conversion pattern of four-piece data with a constraint length of two in Table 3 is determined. When there is a matching pattern, the conversion table 72B determines a conversion code. When the four-piece data does not match a conversion pattern, up to two pieces of data are finally referred to, and whether the two-piece data matches one of the patterns (11), (10), and (01) of two-piece data with a constraint length of one in Table 3 is determined. When there is a matching pattern among the patterns (11), (10), and (01), the conversion table 72A determines a conversion code.

Then, as in the above-described case, each piece of data in the input date string in the shift register 42 is advanced by an amount corresponding to the determined code, and a next detection process is repeated in a similar manner.

As described above, a modulation table and a modulating device are realized which have a basis constitution similar to the 1,7PP code, that is, have a minimum run d=1, a maximum run k=7, and a conversion rate (m:n)=(2:3), perform DSV control efficiently by inserting one DSV control bit at a predetermined position in a data string, and improve an error propagation characteristic by limiting the number of successive occurrences of the minimum run to five.

Incidentally, the order of arrangement of data strings and channel bit strings at each constraint length in Table 3 may be changed as long as the same rule is observed. For example, the part of the constraint length i=1 in Table 3 which part is shown in the following as Table 4 can be arranged as in the following Table 5.

TABLE 4

|  | Data Pattern | Code Pattern |
|---|---|---|
| i = 1 | 11 | *0* |
|  | 10 | 001 |
|  | 01 | 010 |

TABLE 5

|  | Data Pattern | Code Pattern |
|---|---|---|
| i = 1 | 11 | *0* |
|  | 10 | 010 |
|  | 01 | 001 |

Also in this case, a remainder when the number of "1"s as an element of a data string is divided by two and a remainder when the number of "1"s as an element of a channel bit string by two are made to be both 1 or 0 and thus equal to each other.

In addition, each of elements (1) and (0) in data strings of Table 3 can be inverted. Specifically, a part of Table 3 shown as the following Table 6 can be arranged as in Table 7. Also in this case, a remainder when the number of "1"s as an element of a data string is divided by two and a remainder when the number of "1"s as an element of a codeword string is divided by two are both 1 or 0 and thus equal to each other.

TABLE 6

| Data Pattern | Code Pattern |
|---|---|
| 11 | *0* |
| 10 | 001 |

TABLE 6-continued

| Data Pattern | Code Pattern |
| --- | --- |
| 01 | 010 |
| 0011 | 010 100 |
| 0010 | 010 000 |
| 0001 | 000 100 |

TABLE 7

| Data Pattern | Code Pattern |
| --- | --- |
| 00 | *0* |
| 01 | 001 |
| 10 | 010 |
| 1100 | 010 100 |
| 1101 | 010 000 |
| 1110 | 000 100 |

Further, Table 3 can be made as follows on the basis of system requests. For example, when a maximum run k=8 is allowed, the conversion patterns with the constraint length i=4 as substitution patterns for realizing the maximum run k=7 in Table 3 can be omitted. That is, Table 3 from which the conversion patterns with the constraint length i=4 are omitted can realize the RLL code with a minimum run d=1 and a maximum run k=8 by the basic patterns from i=1 to i=3, and generate codeword strings in which the number of successive occurrences of the minimum run is limited to a maximum of five by the substitution patterns with i=3 and i=5 for limiting successive occurrences of the minimum run.

When there can be a tolerance for DSV control performance, the parity of only the part of constraint length i=4 can be made opposite to that of the other parts of Table 3, for example, thereby making Table 3 a table in which a parity rule of a part is different from that of other parts.

In addition, all patterns in each table can be selected such that a remainder when the number of "1"s as an element of a data pattern is divided by two and a remainder when the number of "1"s as an element of a code pattern is divided by two are not equal to each other. In such a case, however, it needs to be performed universally for all the patterns.

Each of these tables can be similarly realized by a modulating device based on the present disclosure.

Figure 20:
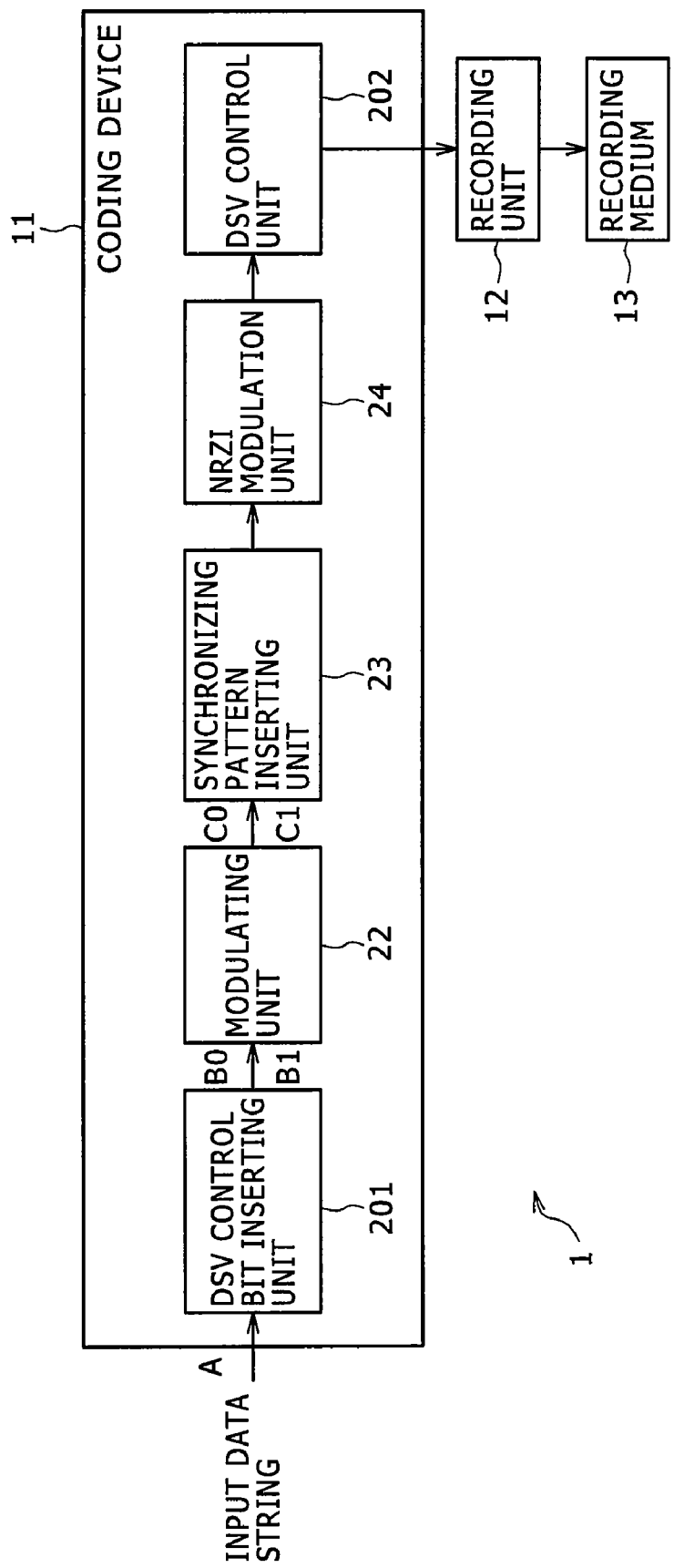
FIG. 20 is a block diagram showing a configuration of a modulating device according to another embodiment.

While the modulating device 1 of FIG. 1 determines and adds an optimum bit of 1 or 0 as a DSV control bit by the DSV control bit determining and inserting unit 21, it is possible to prepare both a data string having a bit 0 added thereto and a data string having a bit 1 added thereto, process each of the data strings, and select one of the data strings in a final stage. FIG. 20 shows an example of configuration of a modulating device in this case.

A coding device 11 in the modulating device 1 of FIG. 20 has a DSV control bit inserting unit 201 disposed therein in place of the DSV control bit determining and inserting unit 21. In addition, a DSV control unit 202 is inserted in a stage succeeding an NRZI modulation unit 24 (in a stage preceding a recording unit 12). The other configuration is the same as shown in FIG. 1.

Specifically, the DSV control bit inserting unit 201 in the modulating device 1 of FIG. 20 generates both a data string (FIG. 21B0) obtained by inserting 0 as a DSV control bit in an input data string (FIG. 21A) and a data string (FIG. 21B1) obtained by inserting 1 as a DSV control bit in the input data string. Then, each of the data strings is supplied to a modulating unit 22 to be converted into a channel bit string (FIG. 21C0 FIG. 21C1). A synchronizing pattern inserting unit 23 inserts a synchronizing pattern in each of the two channel bit strings input from the modulating unit 22, and then outputs the two channel bit strings. The NRZI modulation unit 24 subjects each of the two channel bit strings to NRZI modulation, and then outputs the two channel bit strings to the DSV control unit 202. The DSV control unit 202 selects an optimum one of the two channel bit strings for each span (DSV section), and then supplies the one channel bit string to the recording unit 12. The recording unit 12 records the channel bit string finally selected by the DSV control unit 202 onto a recording medium 13.

As described above, a modulation table and a modulating device can be realized which have a basic constitution similar to the 1,7PP code, that is, have a minimum run d=1, a maximum run k=7, and a conversion rate (m:n)=(2:3), perform DSV control efficiently by inserting one DSV control bit at a predetermined position in a data string, and improve an error propagation characteristic by limiting the number of successive occurrences of the minimum run to five.

A result of verifying results of modulation using the modulation table according to the present embodiment is presented in the following. The number of successive occurrences of Tmin in a channel bit string obtained by performing modulation according to Table 3, limiting successive occurrences of Tmin, and inserting DSV control bits in a data string is limited to five by a plurality of minimum run successive occurrence limiting patterns in particular. Simulation was performed for 1,7PP codes in the past in Table 2 and codes based on Table 3.

Arbitrarily generated random data of 634,880 data bits is subjected to DSV control by inserting one DSV control bit at intervals of 45 data bits in consideration of a synchronizing pattern, and then converted into a codeword string (channel bit string) according to Table 2 or Table 3. Further, a synchronizing pattern is inserted at intervals of 1240 data bits in a data string. A resulting number of channel bits is 989,184 codewords (channel bits). Distributions of occurrences of successive minimum runs in the codeword strings generated in this case are as follows. Incidentally, in Table 8, RMTR(n) denotes the number of occurrences of successive minimum runs when the number of successive minimum runs is n.

TABLE 8

* 1, 7PP Comparison *

|  | 1, 7PP of Table 2 | 1, 7PP of Table 3 |
| --- | --- | --- |
| RMTR(1) | 42730 | 42889 |
| RMTR(2) | 17458 | 17517 |
| RMTR(3) | 6353 | 6349 |
| RMTR(4) | 2536 | 2538 |
| RMTR(5) | 652 | 656 |
| RMTR(6) | 149 | — |
| RMTR(7) | — | — |
| max-RMTR | 6 | 5 |

Table 8 confirms that the 1,7PP code of Table 2 is limited to six successive minimum runs, while the 1,7PP code of Table 3 is limited to five successive minimum runs. It is also understood that as for the distribution of the 1,7PP code of Table 3, there is no number of occurrences RMTR(6), while the numbers of occurrences RMTR(1) to RMTR(5) do not differ greatly, that is, all of the part of RMTR(6) is replaced with other run lengths.

The 1,7PP code has substitution codes for limiting the number of times that a minimum run length is repeated in the conversion table with a minimum run d=1, a maximum run k=7 and a conversion rate (m:n)=2:3, thus providing the following effects.

(1) Recording and reproduction at a high linear density and a tolerance for a tangential tilt are improved.

(2) The number of parts with low signal levels is reduced, accuracy of waveform processing of AGC (Auto Gain Control), a PLL (Phase-Locked Loop) and the like is improved, and therefore overall characteristics can be enhanced.

(3) It is possible to make a design with shorter path memory lengths in Viterbi decoding or the like, and reduce a circuit scale, as compared with a system in the past.

In addition, a remainder when the number of "1"s as an element of a data string forming a conversion pattern in the modulation table is divided by two and a remainder when the number of "1"s as an element of a codeword string is divided by two are both 1 or 0 and thus equal to each other, providing the following effects.

(4) The number of redundant bits for DSV control can be reduced.

(5) At a minimum run d=1 and (m, n)=(2, 3), DSV control can be performed with 1.5 codewords.

(6) In addition to a low level of redundancy, the minimum run and the maximum run can be kept. Further, Table 3 reduces the limited number of successive occurrences of the minimum run from six to five as compared with the 1,7PP code of Table 2, and can therefore further reduce error propagation at times of data recording and reproduction.

As described above, as a pattern of data reproduction errors, an error in which an entire length of successive smallest marks from a first edge to a last edge is shifted can occur. That is, the length of a bit error that occurs extends from a start to an end of the section of the successive smallest marks. Therefore a problem of a long error propagation occurs. By limiting successive occurrences of the minimum run to five times, it is possible to reduce occurrences of such an error, and thus realize more stable recording and reproduction of data.

The table according to the present embodiment has the same basic parameters as the 1,7PP code of Table 2, and the compactness of the table is substantially the same as that of Table 2. It is therefore possible to achieve the above-described effects with an equally simple circuit configuration.

Figure 22:
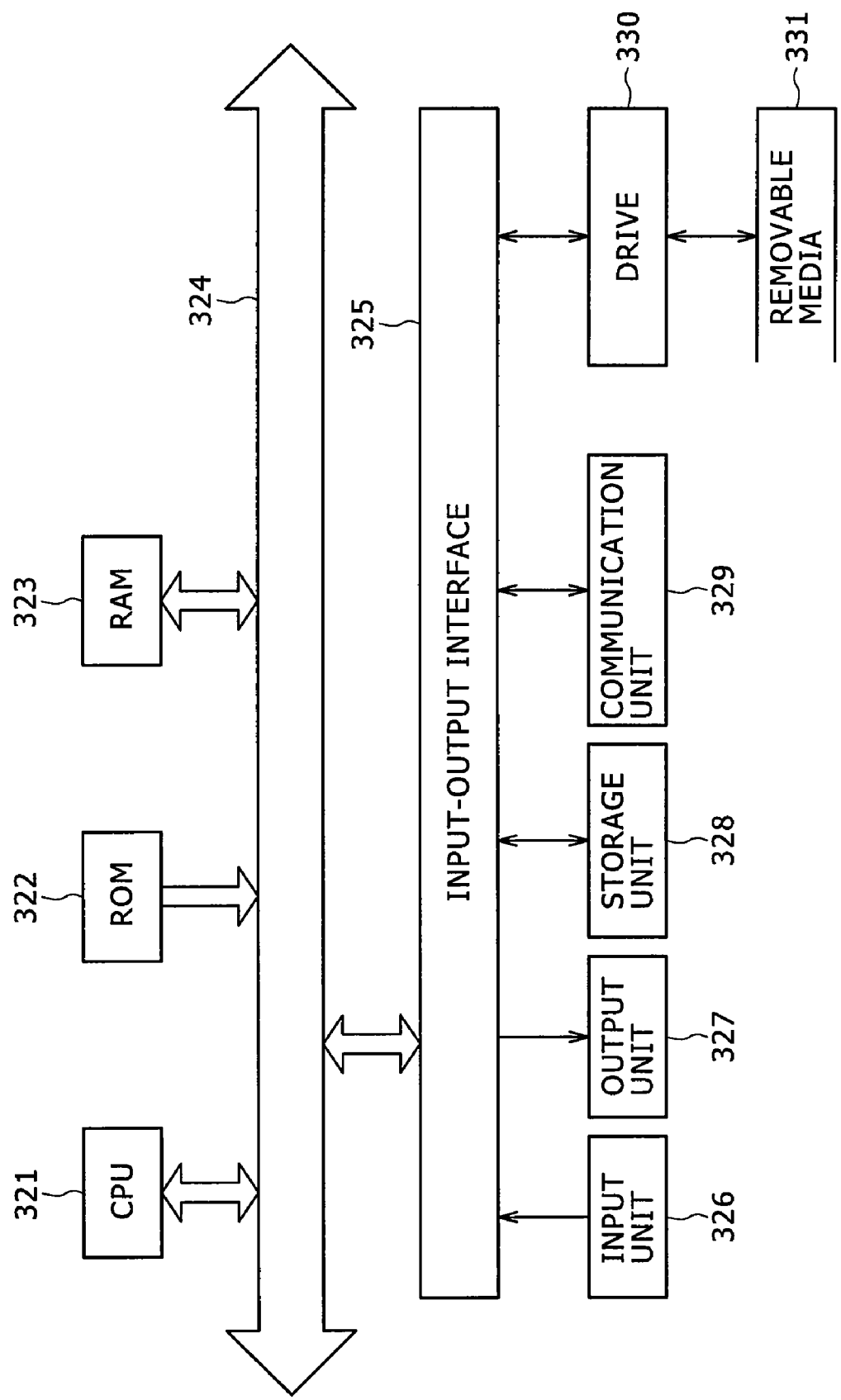
FIG. 22 is a block diagram showing a configuration of a personal computer.

FIG. 22 is a block diagram showing an example of configuration of a personal computer performing the above-described series of processes by a program. A CPU (Central Processing Unit) 321 performs various processes according to a program stored in a ROM (Read Only Memory) 322 or a storage unit 328. A RAM (Random Access Memory) 323 stores the program executed by the CPU 321, data and the like as needed. The CPU 321, the ROM 322, and the RAM 323 are interconnected via a bus 324.

The CPU 321 is also connected with an input-output interface 325 via the bus 324. The input-output interface 325 is connected with an input unit 326 formed by a keyboard, a mouse, a microphone and the like, and an output unit 327 formed by a display, a speaker and the like. The CPU 321 performs various processes in response to a command input from the input unit 326. The CPU 321 then outputs a result of a process to the output unit 327.

The storage unit 328 connected to the input-output interface 325 is formed by a hard disk, for example. The storage unit 328 stores programs to be executed by the CPU 321 and various data. A communication unit 329 communicates with external devices via networks such as the Internet, a local area network and the like. In addition, a program may be obtained via the communication unit 329 and then stored in the storage unit 328.

When removable media 331 such as a magnetic disk, an optical disk, a magneto-optical disk, a semiconductor memory and the like are loaded into a drive 330 connected to the input-output interface 325, the drive 330 drives these removable media 331, and obtains programs, data, and the like recorded on the removable media 331. The obtained programs and data are transferred to the storage unit 328 to be stored therein as needed.

The series of processes described above can be carried out not only by hardware but also by software. When the series of processes is to be carried out by software, a program constituting the software is installed from a program storage medium onto a computer incorporated in special hardware, or for example a general-purpose personal computer that can perform various functions by installing various programs thereon.

As shown in FIG. 22, the program storage medium storing the program to be installed onto a computer and set in a state of being executable by the computer includes the removable media 331 as packaged media including a magnetic disk (including flexible disks), an optical disk (including CD-ROM (Compact Disk-Read Only Memory) and DVD (Digital Versatile Disk)), a magneto-optical disk (including MD (Mini-Disc) (registered trademark)), a semiconductor memory or the like, or includes the ROM 322, the hard disk forming the storage unit 328, or the like where the program is recorded temporarily or permanently. As needed, the storing of the program on the program storage medium is performed via the communication unit 329 as an interface such as a router, a modem or the like using a wire or wireless communication medium such as a local area network, the Internet, digital satellite broadcasting or the like.

It is to be noted that in the present specification, the steps describing the program stored on the program storage medium include not only processes carried out in time series in the described order but also processes carried out in parallel or individually and not necessarily in time series.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A modulation table configured to convert data having a basic data length of m bits into variable length code (d, k; m, n; r) having a maximum constraint length where r>1, having a minimum run of d, where d>0, a maximum run of k, and a basic codeword length of n bits, said modulation table comprising:

a basic table configured to convert data patterns composed of basic data having a basic data length of m bits into code patterns composed of basic codes of variable length code having a basic codeword length of n bits; and a substitution table configured to replace data patterns composed of substitution data with code patterns composed of substitution codes;

wherein said substitution table includes data patterns composed of minimum run successive occurrence limiting data limiting successive occurrences of said minimum run to a maximum of N times and code patterns composed of substitution codes corresponding to said minimum run successive occurrence limiting data, where N>1, and wherein at least one of the substitution codes corresponding to said minimum run successive occurrence limiting data includes an indeterminate code a value of which is determined by one of an immediately preceding codeword string and an immediately succeeding codeword string.

2. The modulation table according to claim 1,
wherein when successive occurrences of the minimum run are limited at d=1, said substitution code includes a codeword "$0$" including the indeterminate code "$" which is "0" when three immediately preceding codes are "010", and is "1" when the three immediately preceding codes are not "010".

3. The modulation table according to claim 2,
wherein said indeterminate code "$" is further set to "0" when an immediately preceding code is "1".

4. A modulation table configured to convert data having a basic data length of m bits into variable length code (d, k; m, n; r) having a maximum constraint length where r>1, having a minimum run of d, where d>0, a maximum run of k, and having a basic codeword length of n bits, said modulation table comprising:

a basic table configured to convert data patterns composed of basic data having a basic data length of m bits into code patterns composed of basic codes of variable length code having a basic codeword length of n bits; and a substitution table configured to replace data patterns composed of substitution data with code patterns composed of substitution codes;

wherein said substitution table includes data patterns composed of minimum run successive occurrence limiting data limiting successive occurrences of said minimum run to a maximum of N times and code patterns composed of substitution codes corresponding to said minimum run successive occurrence limiting data, where N>1, and wherein at least one of the substitution codes corresponding to said minimum run successive occurrence limiting data includes an indeterminate code a value of which is determined by one of an immediately preceding codeword string and an immediately succeeding codeword string;

wherein a first piece of minimum run successive occurrence limiting data of a plurality of pieces of said minimum run successive occurrence limiting data forms a part of a second piece of minimum run successive occurrence limiting data, and wherein when said first piece of minimum run successive occurrence limiting data starts at a midpoint and the next three codes are "010", said second piece of minimum run successive occurrence limiting data is converted into individual codewords, and when the next three codes are not "010", a whole of said second piece of minimum run successive occurrence limiting data is converted en bloc into substitution codes including said indeterminate code.

5. The modulation table according to claim 4,
wherein when the next three codes are "010", a whole of said first piece of minimum run successive occurrence limiting data is converted en bloc into substitution codes not including said indeterminate code.

6. The modulation table according to claim 1,
wherein the N times that said minimum run occurs successively is five times or less.

7. A modulating device for converting data having a basic data length of m bits into variable length code (d, k; m, n; r) having a maximum constraint length where r>1, having a minimum run of d, having a maximum run of k, and having a basic codeword length of n bits, said modulating device comprising:

data converting means configured to convert input data into code according to a conversion table describing correspondences between data patterns and code patterns;

wherein said conversion table includes a first table configured to convert data patterns composed of basic data having a basic data length of m bits into code patterns composed of basic codes of variable length code having a basic codeword length of n bits, and a second table configured to replace data patterns composed of substitution data with code patterns composed of substitution codes, said second table includes data patterns composed of minimum run successive occurrence limiting data limiting successive occurrences of said minimum run to a maximum of N times and code patterns composed of substitution codes corresponding to said minimum run successive occurrence limiting data, where N>1, and at least one of the substitution codes corresponding to said minimum run successive occurrence limiting data includes an indeterminate code, a value of which is determined by one of an immediately preceding codeword string and an immediately succeeding codeword string.

8. A modulating device for converting data having a basic data length of m bits into variable length code (d, k; m, n; r) having a maximum constraint length where r>1, having a minimum run of d, having a maximum run of k, and having a basic codeword length of n bits, said modulating device comprising:

data converting means configured to convert input data into code according to a conversion table describing correspondences between data patterns and code patterns;

wherein said conversion table includes a first table configured to convert data patterns composed of basic data having a basic data length of m bits into code patterns composed of basic codes of variable length code having a basic codeword length of n bits, and a second table configured to replace data patterns composed of substitution data with code patterns composed of substitution codes, said second table includes data patterns composed of minimum run successive occurrence limiting data limiting successive occurrences of said minimum run to a maximum of N times and code patterns composed of substitution codes corresponding to said minimum run successive occurrence limiting data, where N>1, and at least one of the substitution codes corresponding to said minimum run successive occurrence limiting data includes an indeterminate code, a value of which is determined by one of an immediately preceding codeword string and an immediately succeeding codeword string;

wherein said data converting means includes:
first converting means configured to convert input data into a code pattern so as to keep an RLL rule according to said first conversion table;
second converting means configured to convert input data into said code pattern according to said second conversion table such that successive occurrences of said minimum run are limited to the maximum of N times when the input data matches said minimum run successive occurrence limiting data, and determining said indeterminate code; and
selecting means configured to select one of said code pattern in which said indeterminate code is determined and said code pattern converted according to said conversion table described in a fixed manner.

9. The modulating device according to claim 8, further comprising:
RLL information generating means configured to generate information for keeping the RLL rule; and
limiting information generating means configured to generate information for limiting successive occurrences of said minimum run to the maximum of N times;
wherein said second converting means determines said indeterminate code on a basis of the generated information for keeping said RLL rule and the generated information for limiting successive occurrences of said minimum run to the maximum of N times.

10. The modulating device according to claim 9, further comprising:
first detecting means configured to detect that a first piece of minimum run successive occurrence limiting data of a plurality of pieces of said minimum run successive occurrence limiting data starts at a midpoint of a data string and that the next three codes are "010"; and
second detecting means configured to detect a second piece of minimum run successive occurrence limiting data including said first piece of minimum run successive occurrence limiting data as a part of said second piece of minimum run successive occurrence limiting data;
wherein when said first piece of minimum run successive occurrence limiting data starts at a midpoint of a data string and the next three codes are "010", said selecting means converts said second piece of minimum run successive occurrence limiting data into individual codewords, and if the next three codes are not "010", said selecting means converts a whole of said second piece of minimum run successive occurrence limiting data en bloc into substitution codes including said indeterminate code.

11. The modulating device according to claim 10, wherein if the three codes next to said first piece of minimum run successive occurrence limiting data are "010", said selecting means converts a whole of said first piece of minimum run successive occurrence limiting data en bloc into a code pattern not including said indeterminate code.

12. The modulating device according to claim 7, further comprising storage means configured to store at least 15-bit data of said input data.

13. The modulating device according to claim 7, wherein said data converting means limits the successive occurrences of said minimum run to a maximum of five times.

14. A recording medium on which a signal modulated by the modulating device of claim 7 is recorded.

15. A modulating method for converting data having a basic data length of m bits into variable length code (d, k; m, n; r) having a maximum constraint length r>1, having a minimum run of d, a maximum run of k, and a basic codeword length of n bits, said modulating method comprising:
converting input data into code according to a conversion table describing correspondences between data patterns and code patterns;
wherein said conversion table includes
a first table configured to convert data patterns composed of basic data having a basic data length of m bits into code patterns composed of basic codes of variable length code having a basic codeword length of n bits, and
a second table for replacing data patterns composed of substitution data with code patterns composed of substitution codes,
said second table includes data patterns composed of minimum run successive occurrence limiting data limiting successive occurrences of said minimum run to a maximum of N times and code patterns composed of substitution codes corresponding to said minimum run successive occurrence limiting data, where N>1, and
at least one of the substitution codes corresponding to said minimum run successive occurrence limiting data includes an indeterminate code a value of which is determined by one of an immediately preceding codeword string and an immediately succeeding codeword string.

16. A program stored in a readable medium executed by a computer, said program converting data having a basic data length of m bits into variable length code (d, k; m, n; r) having a maximum constraint length r>1, having a minimum run of d, a maximum run of k, and a basic codeword length of n bits, said program comprising the step of:
converting input data into code according to a conversion table describing correspondences between data patterns and code patterns;
wherein said conversion table includes
a first table for converting data patterns composed of basic data having a basic data length of m bits into code patterns composed of basic codes of variable length code having a basic codeword length of n bits, and
a second table for replacing data patterns composed of substitution data with code patterns composed of substitution codes,
said second table includes data patterns composed of minimum run successive occurrence limiting data limiting successive occurrences of said minimum run to a maximum of N times and code patterns composed of substitution codes corresponding to said minimum run successive occurrence limiting data, where N>1, and
at least one of the substitution codes corresponding to said minimum run successive occurrence limiting data includes an indeterminate code a value of which is determined by one of an immediately preceding codeword string and an immediately succeeding codeword string.

* * * * *